United States Patent
Lu et al.

(10) Patent No.: US 9,478,314 B2
(45) Date of Patent: Oct. 25, 2016

(54) MEMORY UTILIZING BUNDLE-LEVEL STATUS VALUES AND BUNDLE STATUS CIRCUITS

(71) Applicant: MACRONIX INTERNATIONAL CO., LTD., Hsinchu (TW)

(72) Inventors: Hungwei Lu, Taichung (TW); Wei-An Lai, Taichung (TW); Shuo-Nan Hung, Hsinchu (TW); Chi Lo, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 89 days.

(21) Appl. No.: 14/486,963

(22) Filed: Sep. 15, 2014

(65) Prior Publication Data

US 2016/0077153 A1    Mar. 17, 2016

(51) Int. Cl.
| G11C 29/00 | (2006.01) |
| G11C 29/42 | (2006.01) |
| G11C 29/44 | (2006.01) |
| G11C 29/52 | (2006.01) |
| G11C 16/00 | (2006.01) |
| G11C 29/04 | (2006.01) |

(52) U.S. Cl.
CPC .............. G11C 29/42 (2013.01); G11C 29/44 (2013.01); G11C 29/52 (2013.01); G11C 16/00 (2013.01); G11C 2029/0411 (2013.01)

(58) Field of Classification Search
CPC ....... G11C 29/42; G11C 29/44; G11C 29/52; G11C 16/00; G11C 2029/0411
See application file for complete search history.

(56) References Cited

U.S. PATENT DOCUMENTS

| 7,099,213 B2 | 8/2006 | Ju |
| 7,778,091 B2 | 8/2010 | Park et al. |
| 2012/0314504 A1* | 12/2012 | Komai .................. G11C 16/06 365/185.22 |
| 2014/0258794 A1 | 9/2014 | Yang et al. |

\* cited by examiner

*Primary Examiner* — Bryce Bonzo
*Assistant Examiner* — Thien D Nguyen
(74) *Attorney, Agent, or Firm* — Yiding Wu; Haynes Beffel & Wolfeld LLP

(57) ABSTRACT

An integrated circuit memory includes a memory array, including a plurality of data lines. A buffer structure is coupled to the plurality of data lines, including a plurality of storage elements to store bit-level status values for the plurality of data lines. The memory includes logic to indicate bundle-level status values of corresponding bundles of storage elements in the buffer structure based on the bit-level status values of bits in the corresponding bundles. A plurality of bundle status circuits is arranged in a daisy chain and coupled to respective bundles in the buffer structure, producing an output of the daisy chain indicating detection of a bundle in the first status. Control circuitry executes cycles to determine the output of the daisy chain, each cycle clearing a bundle status circuit indicating the first status if the output indicates detection of a bundle in the first status in the cycle.

19 Claims, 12 Drawing Sheets

MEMORY UTILIZING BUNDLE-LEVEL STATUS VALUES AND BUNDLE STATUS CIRCUITS

FIELD OF THE INVENTION

The present invention relates to memory devices and more particularly relates to verify circuits in memory devices.

DESCRIPTION OF RELATED ART

As the process in manufacturing of integrated circuit memory devices continues to shrink and more layers of memory cells are stacked in the memory devices, the number of defects in memory cells increases. For example, such defects can include open bit-line contacts in a NAND Flash array. This kind of defect can be either repaired with redundant cells, or tolerated if the number of defects is limited during a program or erase operation. If tolerated, the total number of defects for both erase and program operations in one page should be less than the ECC number requirement for each page, so that the ECC in read operation can fix the errors from the defects.

A detecting circuit in memory devices is described in our co-pending U.S. patent application Ser. No. 14/055,656; filed 16 Oct. 2013, entitled MEMORY PAGE BUFFER which is incorporated by reference as if fully set forth herein. The detecting circuit uses a Fail Bit Detection Unit (FBDU) to store the fail bit information for each bit line coupled to a page buffer, and provides accurate counting of the fail bit information for all bit lines in the page buffer. Multiple FBDUs corresponding to respective bit lines are connected in series. One problem with the detecting circuit is that time to process the FBDUs corresponding to bit lines can be significant. Another problem with the detecting circuit is that locations of defects are not known. For instance, the detecting circuit can detect that there are 3 fail bits in 1,024 bits of data, but the detecting circuit does not provide locations of the 3 fail bits.

It is desirable to provide a detecting circuit that reduces the operating time and provides locations of the defects.

SUMMARY

An integrated circuit memory includes a memory array, including a plurality of data lines. A buffer structure is coupled to the plurality of data lines, including a plurality of storage elements to store bit-level status values for data lines in the plurality of data lines. The memory includes logic to indicate bundle-level status values of corresponding bundles of storage elements in the buffer structure based on the bit-level status values of bits in the corresponding bundles.

The logic includes a plurality of bundle status circuits arranged in a daisy chain, where the bundle status circuits are coupled to respective bundles in the buffer structure, and produce an output of the daisy chain indicating detection of a bundle in the first status. The logic includes control circuitry which executes cycles to determine the output of the daisy chain, each cycle clearing a bundle status circuit indicating the first status if the output indicates detection of a bundle in the first status in the cycle, and repeating the cycles until the output indicates no bundle status circuits have the first status. The logic includes keeping count of bundle status circuits indicating the first status during the cycles.

For instance, the count of bundle status circuits indicating the first status can be used in redundancy analysis of the memory array in the integrated circuit memory. The memory array can include a plurality of blocks of memory cells, and a count of bundle status circuits indicating the first status can be kept for each of the blocks and compared to a criterion to determine if a block should be marked as a bad block.

A bundle as used in the present specification is a multi-bit data unit that includes 2 or more bits. A bundle of storage elements includes 2 or more storage elements. A bit-level status value indicates whether an error is detected on a data line. A bundle-level status value indicates whether an error is detected on at least a data line in a bundle of data lines. The bit-level status values and the bundle-level status values include a first status indicating a fail status for an error detected for example during program operation, and a second status indicating a pass status for no error detected.

The memory further includes logic, in response to detection of a bundle having at least one bit with the first status, to count the storage elements in the buffer structure within the bundle having the first status, and to identify a storage element in the buffer structure within the bundle having the first status.

The memory further includes control logic executing program operation, including a program cycle including program pulse and program verify, and executing another program cycle if the number of storage elements having the first status in the buffer structure exceeds a retry threshold. The retry threshold can have a value that corresponds with error correcting logic used with the memory. For example, if the error checking logic is capable of correcting four bit errors, then the retry threshold can be five. Each cycle executed by the control circuitry can include searching for a bundle status circuit indicating the first status, if the output of the daisy chain indicates detection of a bundle in a first status in the cycle and before clearing the bundle status circuit indicating the first status. For each cycle in searching, bundle status circuits in a portion of the daisy chain can be configured to pass input signal levels in response to bundle-level status values stored in the bundle status circuits in the portion, bundle status circuits outside the portion and in the daisy chain can be configured to pass input signal levels independent of bundle-level status values stored in the bundle status circuits outside the portion and in the daisy chain, and search for the bundle status circuit indicating the first status can be executed within the portion.

When a bundle is detected to be in the first state (e.g. fail), storage elements in the buffer structure within the bundle having the first status can be identified, such that global bit lines corresponding to the storage elements having the first status can be located and repaired for example with redundancy bit lines.

A bundle status circuit in the plurality of bundle status circuits includes a first latch, a pass gate and a second latch. The first latch stores a bundle-level status value of a corresponding bundle of data in the buffer structure based on bit-level status values of bits in the corresponding bundle. The pass gate is connected to an input of the bundle status circuit to pass an input signal level at the input to the output of the bundle status circuit, in response to the bundle-level status value stored in the first latch and a selection input of the bundle status circuit. The second latch is coupled to the first latch, having a first state in which the first latch storing the first status keeps the first status, and having a second state in which the first latch storing the first status is cleared, wherein the first state and the second state are set in response to the input signal level at the input of the bundle status circuit.

A bundle status circuit in the plurality of bundle status circuits includes circuitry configured so that, if the selection input is at a first signal level, the pass gate passes the input signal level to the output in response to a bundle-level status value stored in the bundle status circuit, and if the selection input is at a second signal level, the pass gate passes the input signal level to the output independent of the bundle-level status value stored in the bundle status circuit.

A bundle status circuit in the plurality of bundle status circuits includes circuitry configured, in response to detection of a bundle having at least one bit with the first status, to copy bit-level status values stored in the bundle in the buffer structure to a set of bit-level status lines.

The memory includes circuitry configured to initialize a bundle status circuit for a respective bundle, storing the first status in the bundle status circuit if a bit-level status value stored in at least one of the storage elements in the respective bundle is the first status, otherwise storing a second status different than the first status in the bundle status circuit.

A daisy chain including a plurality of bundle status circuits as described in the present technology reduces the operating time in comparison to the detecting circuit as described in our co-pending patent application, because each of bundle status circuits in the plurality of bundle status circuits is coupled to a respective bundle in the buffer structure. For instance, if a bundle includes 8 bits, then the time to pass a detection signal through the daisy chain is reduced by approximately a factor of 8, assuming a relatively small portion of the data in the memory array fails an erase or program operation.

When a bundle is detected to be in the first state (e.g. fail), storage elements in the buffer structure within the bundle having the first status can be identified and counted. The control circuitry can then determine whether the count of fail bits is less than the ECC number requirement for each page, so that the ECC in read operation can fix the fail bits.

A method of operating an integrated circuit memory utilizing the present technology is also provided.

Other aspects and advantages of the present invention can be seen on review of the drawings, the detailed description and the claims, which follow.

DETAILED DESCRIPTION

Figure 1:
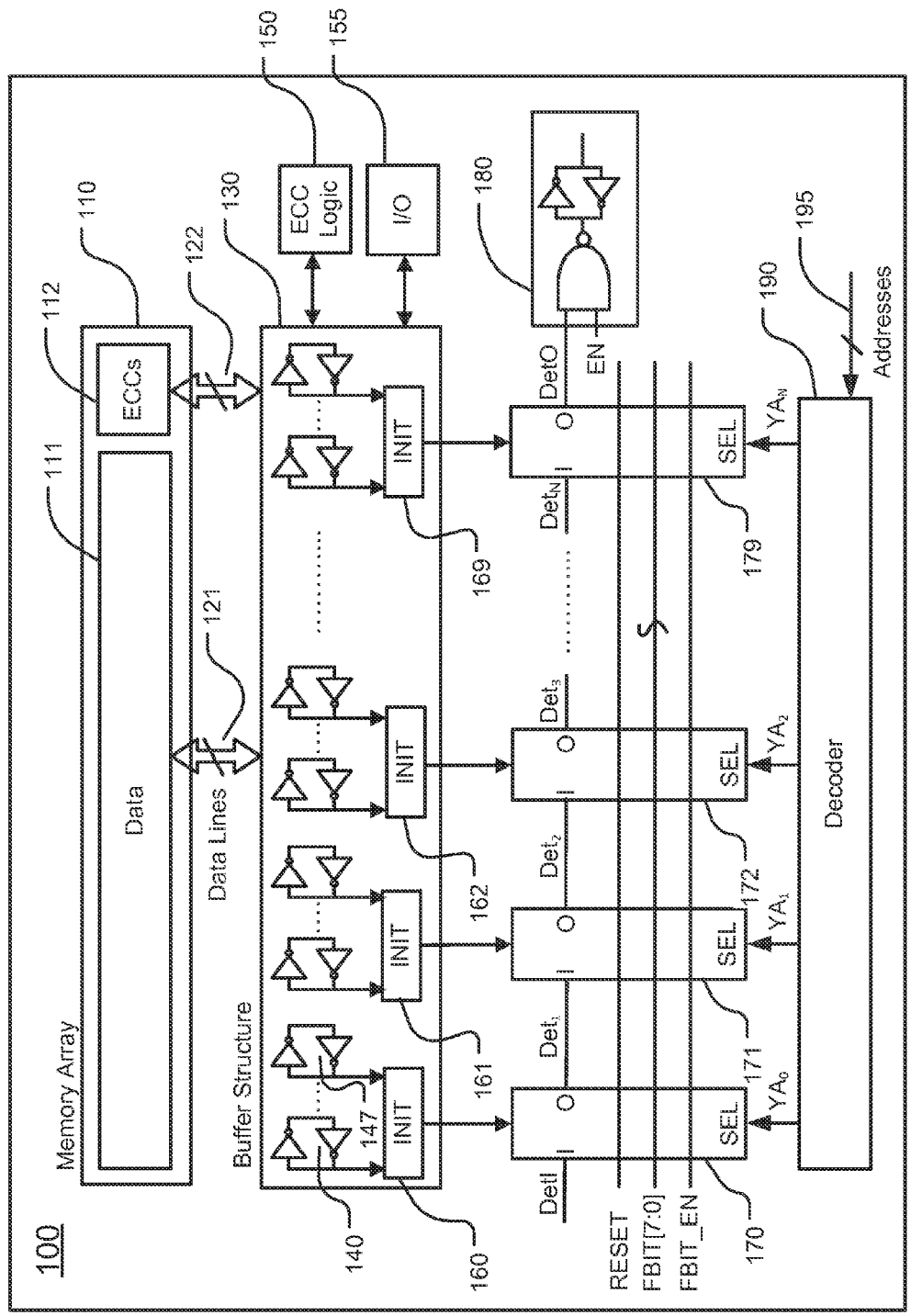
FIG. 1 is a block diagram illustrating an integrated circuit memory including a plurality of bundle status circuits.

A detailed description of embodiments of the present invention is provided with reference to the Figures. The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a block diagram illustrating an integrated circuit memory. A memory 100 includes a memory array 110, including a plurality of data lines (e.g. 121). The memory includes a buffer structure 130 coupled to the plurality of data lines. The buffer structure includes a plurality of storage elements (e.g. 140-147) to store bit-level status values for data lines in the plurality of data lines. The bit-level status values for data lines in the plurality of data lines are determined by a verify circuit during a program or erase operation (not shown). The memory includes logic to indicate bundle-level status values of corresponding bundles of storage elements in the buffer structure based on the bit-level status values of bits in the corresponding bundles.

The logic includes a plurality of bundle status circuits (e.g. 170, 171, 172, 179) arranged in a daisy chain, where the bundle status circuits are coupled to respective bundles in the buffer structure, and produce an output of the daisy chain (e.g. DetO) that can indicate detection of a bundle in the first status. The daisy chain starts at a first bundle status circuit 170 and ends at a last bundle status circuit 179. Each of bundle status circuits in the daisy chain other than the first bundle status circuit receives an output produced by another bundle status circuit in a previous stage in the daisy chain. For instance, a bundle status circuit 171 receives an output produced by the bundle status circuit 170 via a signal $Det_1$, a bundle status circuit 172 in the daisy chain receives an output produced by the bundle status circuit 171 via a signal $Det_2$, and so on.

The logic includes control circuitry which executes cycles to determine the output of the daisy chain, each cycle clearing a bundle status circuit indicating the first status if the output indicates detection of a bundle in the first status in the cycle. The control circuitry repeats the cycles until the output indicates no bundle status circuits have the first status. The logic can include keeping count of bundle status circuits indicating the first status during the cycles.

Circuitry 160 is configured to initialize a bundle status circuit (e.g. 170) for a respective bundle, storing the first status in the bundle status circuit if a bit-level status value stored in at least one of the storage elements (e.g. 140-147) in the respective bundle is the first status, otherwise storing the second status in the bundle status circuit. Circuitry 160 is further described in connection with FIG. 2A.

Circuitry 180 is coupled to the output of the ending bundle status circuit (e.g. 179) in the daisy chain to keep count of bundle status circuits indicating the first status. Circuitry 180 is disabled if an enable input (e.g. EN) is applied a first signal level (e.g. EN=0), and is enabled if the enable input (e.g. EN) of the second circuit is applied a second signal level (e.g. EN=1) different than the first signal level.

The memory includes selection signals (e.g. $YA_0$, $YA_1$, $YA_2$, $YA_n$) to select bundle status circuits in searching for bundle status circuits indicating the first status. The selection signals can be generated by a decoder 190 from addresses 195, and coupled to selection inputs (e.g. SEL) of bundle status circuits in the plurality of bundle status circuits. For instance, the decoder can decode $log_2 N$ addresses to generate N selection signals for N respective bundle status circuits.

Control signals RESET and FBIT_EN, and a set of bit-level status lines (e.g. FBIT[7:0]) are coupled to each of bundle status circuits in the plurality of bundle status circuits, and are described in connection with FIG. 2.

The memory array 110 can store data 111, and error correcting codes ECCs 112 for corresponding data. Data 111 can be read from the memory array into the buffer structure 130 via the plurality of data lines 121, while corresponding ECCs 112 can be read from the memory array into the buffer structure via a plurality of ECC lines 122. The memory includes input/output circuit 155 and ECC logic 150, both coupled to the buffer structure.

Figure 2A:
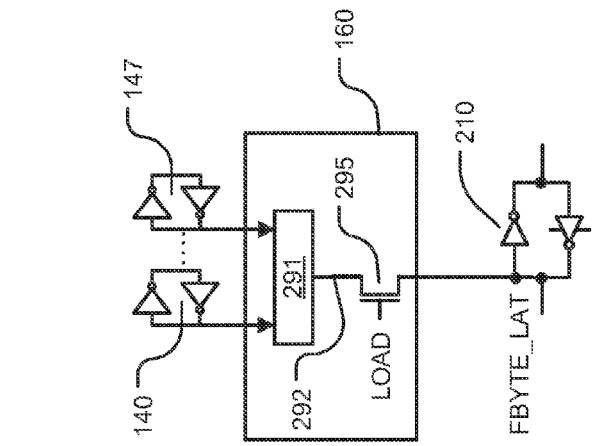
FIG. 2A is a schematic diagram illustrating example circuitry configured to initialize a bundle status circuit for a respective bundle.
Figure 2:
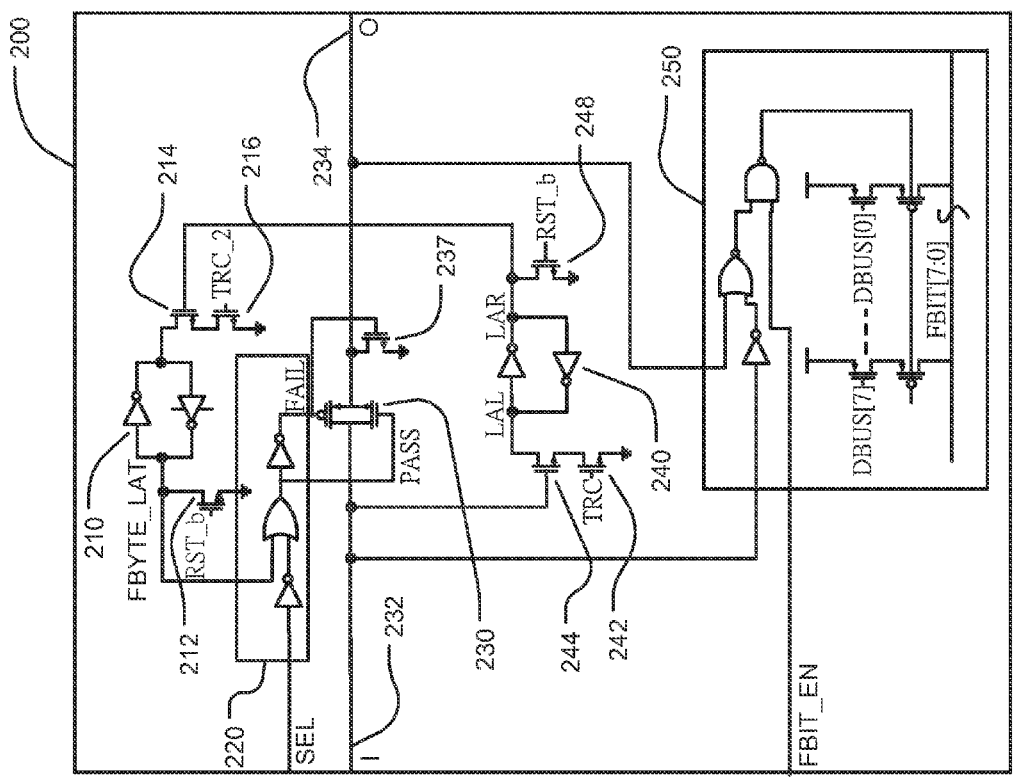
FIG. 2 is a schematic diagram illustrating an example bundle status circuit shown in FIG. 1.

FIG. 2 is a schematic diagram illustrating an example bundle status circuit in the plurality of bundle status circuits as shown in FIG. 1. The bundle status circuit includes a first latch (e.g. 210), a pass gate (e.g. 230), and a second latch (e.g. 240). The first latch (e.g. 210) stores a bundle-level status value from a respective bundle of storage element in the buffer structure. The pass gate (e.g. 230) is connected to an input (e.g. 232) and an output of the bundle status circuit (e.g. 234), to pass an input signal level at the input to the output of the bundle status circuit, in response to the bundle-level status value stored in the first latch and a selection input of the bundle status circuit (e.g. SEL).

The second latch (e.g. 240) is coupled to the first latch, having a first state in which the first latch storing the first status keeps the first status, and having a second state in which the first latch storing the first status is cleared, wherein the first state and the second state are set in response to the input signal level.

The bundle status circuit includes circuitry (e.g. 220) configured to select whether to produce an output in response to the bundle-level status value stored in the first latch, or to pass an input signal level at the input to the output independent of the bundle-level status value stored in the first latch. In one implementation, if the selection input is at a first signal level (e.g. SEL=1), the pass gate passes the input signal level to the output in response to a bundle-level status value stored in the bundle status circuit, and if the selection input is at a second signal level (e.g. SEL=0), the pass gate passes the input signal level to the output independent of the bundle-level status value stored in the bundle status circuit. When the selection input is at the first signal level (e.g. SEL=1), the pass gate passes the input signal level to the output if the first latch stores a second status (e.g. pass), and blocks the input signal level from being passed to the output if the first latch stores the first status (e.g. fail). When the input signal level is blocked, transistor 237 is turned on, providing logic low to the output 234.

The bundle status circuit includes circuitry (e.g. 250) configured, in response to detection of a bundle having at least one bit with the first status, to copy bit-level status values stored in the bundle in the buffer structure via a data bus (e.g. DBUS[7:0]) to a set of bit-level status lines (e.g. FBIT[7:0]). The circuitry (e.g. 250) is disabled if an enable input (e.g. FBIT_EN) of the bundle status circuit is applied a first signal level (e.g. FBIT_EN=0), and is enabled if the enable input (e.g. FBIT_EN) of the bundle status circuit is applied a second signal level (e.g. FBIT_EN=1) different than the first signal level. The truth table below describes the circuitry 250 in the bundle status circuit, where DETI corresponds to the input of the bundle status circuit (e.g. 232, FIG. 2) and DETO corresponds to the output of the bundle status circuit (e.g. 234, FIG. 2). As shown in the table below, at Row 1, when FBIT_EN=0, the set of bit-level status lines (e.g. FBIT[7:0]) is at 0, regardless of the values at DETI and DETO. At Row 2 and Row 3, when FBIT_EN=1 and DETI=0 for a bundle status circuit in a daisy chain, the bundle status circuit does not detect any fail bits regardless of the value at DETO, and consequently the set of bit-level status lines (e.g. FBIT[7:0]) is at 0. At Row 4, when FBIT_EN=1, DETI=1 and DETO=0, the bundle status circuit detects one or more fail bits and fail bits detected are loaded to the set of bit-level status lines (e.g. FBIT[7:0]). At Row 5, when FBIT_EN=1, DETI=1 and DETO=1, the bundle status circuit does not detect any fail bits, and consequently the set of bit-level status lines (e.g. FBIT[7:0]) is at 0.

| Row # | FBIT_EN | DETI | DETO | FBIT[7:0] |
|---|---|---|---|---|
| 1 | 0 | X | X | 0 |
| 2 | 1 | 0 | 0 | 0 |
| 3 | 1 | 0 | 1 | 0 |
| 4 | 1 | 1 | 0 | Fail Bits |
| 5 | 1 | 1 | 1 | 0 |

The processing of the plurality of bundle status circuits starts by resetting the first latch and the second latch in each of the bundle status circuits in the plurality of bundle status circuits, via the RESET signal as shown in FIG. 1, which is coupled to the reset signal RST_b as shown in FIG. 2. The RST_b signal is applied to transistor 212 connected to the first latch 210, and to transistor 248 connected to the second latch 240. Bundle status circuits in the daisy chain are then initialized with bundle-level status values.

A cycle starts when a detection signal is applied at the input of the bundle status circuit starting the daisy chain, and ends when an output signal is produced at the output of the bundle status circuit ending the daisy chain. If multiple bundle status circuits in the daisy chain indicate the first status, then multiple cycles are needed to detect the multiple bundle status circuits indicating the first status. Before the first cycle starts, the second latch in each of the bundle status circuits in the plurality of bundle status circuits is reset to the first state for example by a high pulse on the RST_b signal, providing logic low at an output of the second latch (e.g. LAR). During a cycle, in response to detection of a bundle having at least one bit with the first status, the second latch of a bundle status circuit is changed to the second state, providing logic high at the output of the second latch (e.g. LAR). If a particular bundle status circuit indicating the first status is detected in a cycle, a count of bundle status circuits indicating the first status is incremented accordingly. After the count is incremented, the control circuitry applies first and second clear signals (e.g. TRC, TRC_2) to change the first latch in the particular bundle status circuit to store the second status (e.g. pass), and to change the second latch in the particular bundle status circuit to the second state, so that subsequent cycles will not re-count the particular bundle status circuit, and can count other bundle status circuits that indicate the first status and have not been counted yet. The first and second clear signals (e.g. TRC, TRC_2) are two non-overlapping pulses.

The second clear signal TRC_2 is subsequent to the first clear signal TRC. The second latch 240 detects the input signal 232 before the pass gate 230. Transistor 242 is in series with transistor 244 between the second latch 240 and ground. Transistor 242 has a gate coupled to the first clear signal TRC, and transistor 244 has a gate coupled to the input 232. If the signal level at the input 232 is high, then when the first clear signal TRC arrives, the second latch 240 changes to the second state, providing logic high at an output of the second latch (e.g. LAR).

Transistor 216 is in series with transistor 214 between the first latch 210 and ground. Transistor 216 has a gate coupled to the second clear signal TRC_2, and transistor 214 has a gate coupled to the second latch 240. Subsequently, when the second clear signal TRC_2 arrives, the first latch 210 can change to the second status (e.g. pass) at an output of the first latch (e.g. FBYTE_LAT), depending on the information stored in the second latch 240.

If a particular bundle status circuit indicating the first status (e.g. fail) is not detected during a cycle, then another bundle status circuit indicating the first status before the particular bundle status circuit has been detected, and consequently logic low is propagated to the input of the particular bundle status circuit. When the input signal is at a low level at the input of the particular bundle status circuit, the second latch 240 in the particular bundle status circuit remains at the first state as before the first cycle starts, providing logic low at the output of the second latch (e.g. LAR) so the first latch 210 does not change its status value. Accordingly, the second latch 240 ensures that the first latch changes from the first status to the second status after a cycle only if the first status is detected during the cycle.

Logic high and logic low as used in the present specification refers to two logic levels that a signal can have. Logic high and logic low correspond to a binary 1 and a binary 0 respectively. The logic levels are represented by the voltage difference between the signal and a ground voltage. For instance, logic high can be represented by a voltage at or near a supply voltage, and logic low can be represented by a voltage at or near the ground voltage.

FIG. 2A is a schematic diagram illustrating example circuitry (e.g. 160) configured to initialize a bundle status circuit for a respective bundle. In the example of FIG. 2A, a bundle of storage elements (e.g. 140-147) is as described in connection with FIG. 1, and a first latch (e.g. 210) in a bundle status circuit (e.g. 200) having a terminal connected to signal FBYTE_LAT is as described in connection with FIG. 2.

The circuitry (e.g. 160) includes a first element 291 that produces at its output (e.g. 292), the first status for a bundle of storage elements (e.g. 140-147) if a status value stored in at least one of the storage elements in the bundle is the first status, otherwise the second status. For instance, the first status can be a fail status, and the second status can be a pass status.

The circuitry (e.g. 160) includes a second element 295 that can be a pass gate. The pass gate has a first terminal connected to the output of the first element 291 (e.g. 292), a second terminal connected to the signal FBYTE_LAT, and a gate terminal connected to a gate signal LOAD. In one implementation, in response to a high pulse applied to the gate signal LOAD, the pass gate passes the signal level at the output of the first element (e.g. 292) to initialize the first latch (e.g. 210) in the bundle status circuit (e.g. 200).

Figure 3:
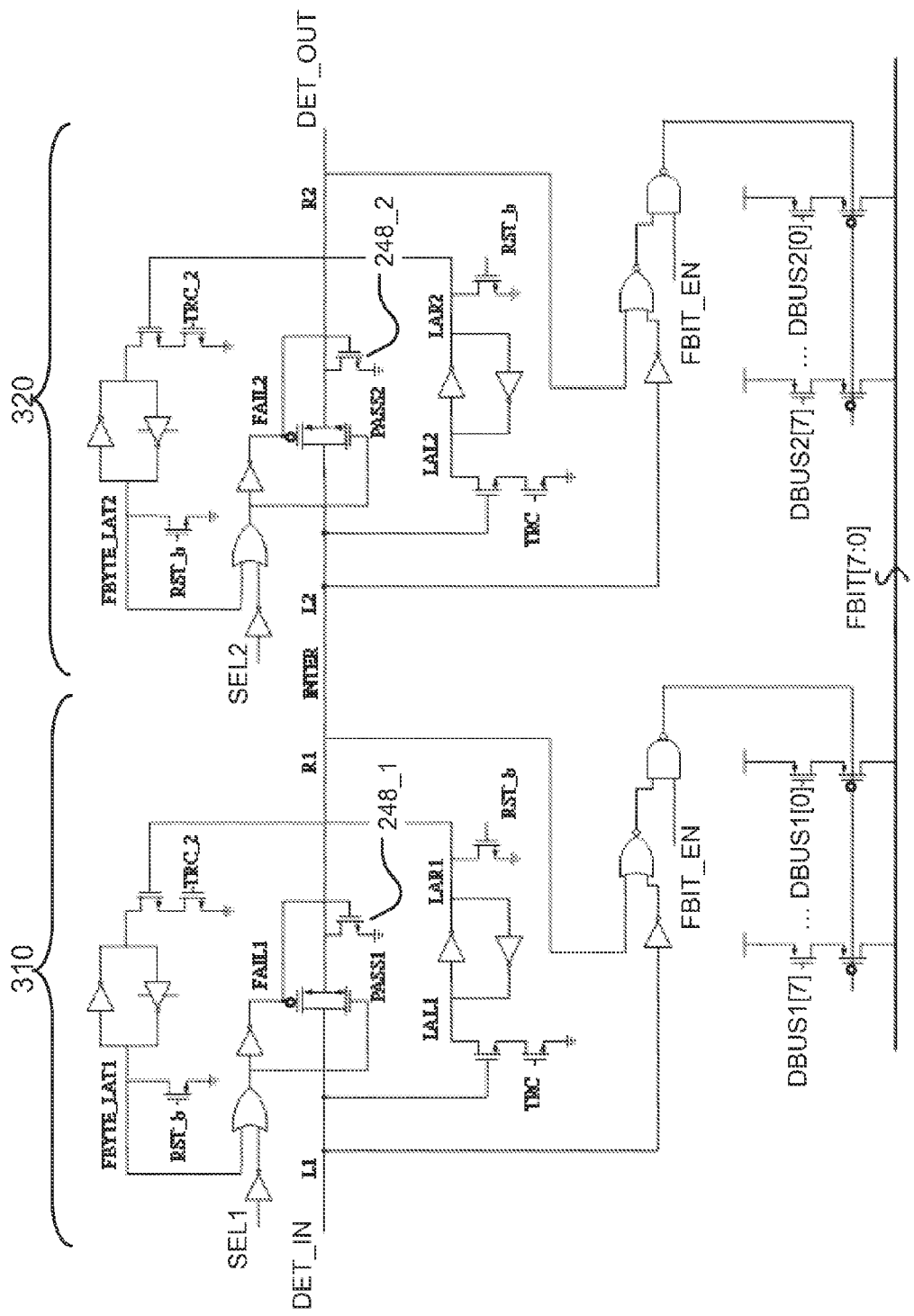
FIG. 3 is an example daisy chain including two bundle status circuits.

FIG. 3 is an example daisy chain including two bundle status circuits (e.g. 310, 320). Bundle status circuit 310 has an input L1 and an output R1, while bundle status circuit 320 has an input L2 and an output R2. The output of a prior stage is coupled to the input of the following stage in the daisy chain. For instance, the output of the bundle status circuit 310 (e.g. R1) is coupled to the input of the following stage (e.g. L2). Bit-level status values stored in storage elements in bundles of storage elements via data busses (e.g. DBUS1 [7:0], DBUS2[7:0]) are different for different bundle status circuits in the daisy chain. Selection inputs (e.g. SEL1, SEL2) are different for different bundle status circuits. Control signals (e.g. RST_b, FBIT_EN), clear signals (e.g. TRC, TRC_2), and the set of bit-level status lines (e.g. FBIT[7:0]) are common to different bundle status circuits.

Figure 4:
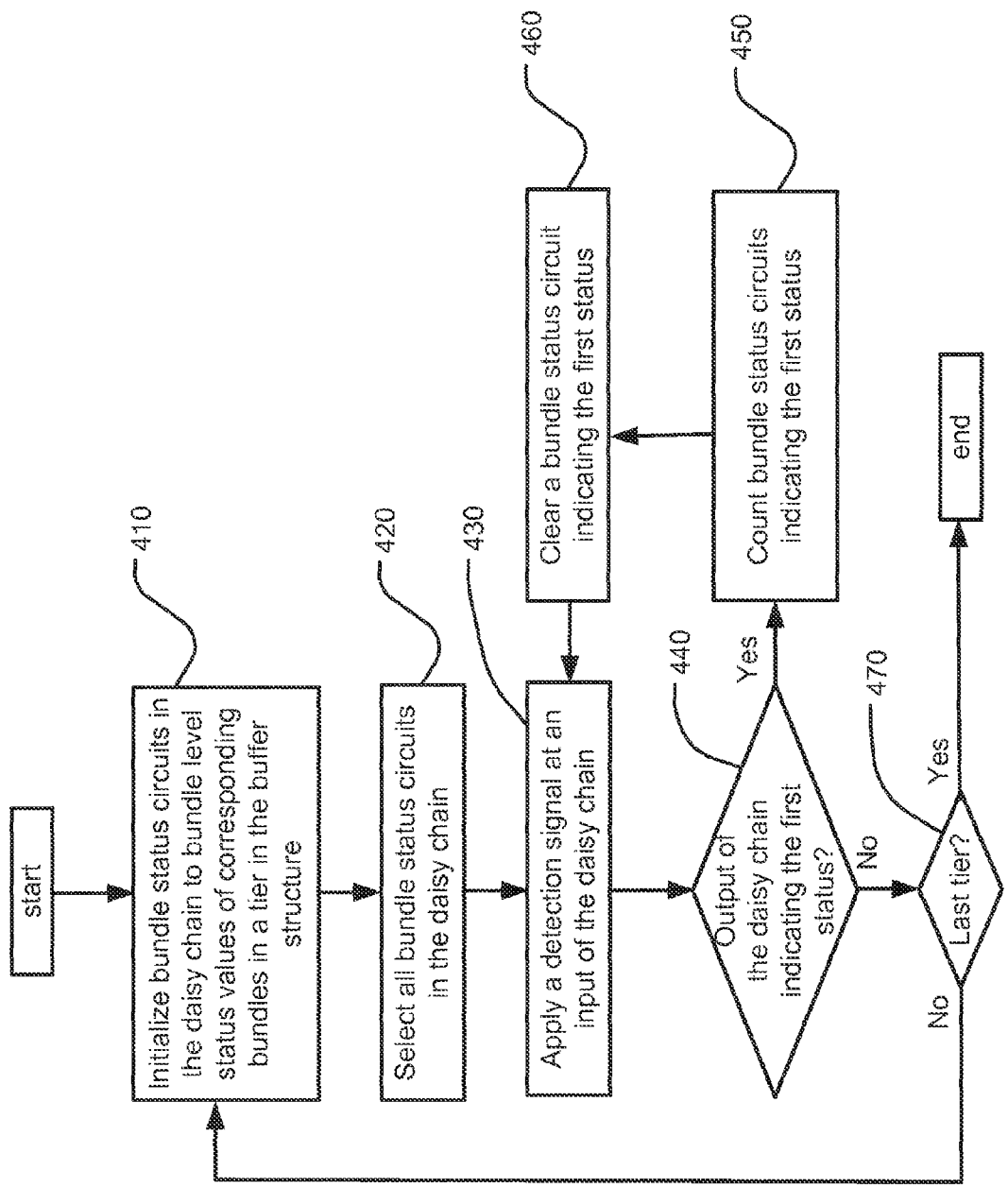
FIG. 4 is a flow chart for keeping count of bundle status circuits indicating the first status.

FIG. 4 is a flow chart for keeping count of bundle status circuits indicating the first status, in an integrated circuit memory as described in connection with FIG. 1. The buffer structure (e.g. 130, FIG. 1) includes a plurality of storage elements (e.g. 140-147) storing bit-level status values for data lines in the plurality of data lines in the memory array. Each of the bundle status circuits in the plurality of bundle status circuits (e.g. 170, 171, 172, 179, FIG. 1) stores a bundle-level status value for a bundle in the buffer structure. For instance, a bundle can include 8 storage elements storing status values for 8 respective data lines in the plurality of data lines. A bundle status circuit indicates the first status for a bundle if at least one of the storage elements in the bundle stores the first status.

At Step 410, bundle status circuits in a daisy chain are initialized to bundle-level status values of corresponding bundles in a tier in the buffer structure. A tier as used in the present application refers to a portion or all of the plurality of storage elements in the buffer structure. If the daisy chain has at least as many bundle status circuits as the bundles of storage elements in the buffer structure, then there can be only one tier for the bundles of storage elements in the buffer structure. If the daisy chain has fewer bundle status circuits than the bundles of storage elements in the buffer structure, then the daisy chain needs to be initialized, in turn, with multiple tiers of bundles of storage elements. For instance, if the buffer structure can store 2,048 bytes which are divided into 16 tiers, and each bundle includes 8 storage elements storing status values for a byte, then the daisy chain needs to include 2,048/16=128 bundle status circuits for 128 bytes in a tier. A daisy chain including N bundle status circuits can be addressed by an address bus of $\log_2 N$ bits. For instance, a daisy chain including 128 bundle status circuits can be addressed by a bundle address bus of $\log_2 128=7$ bits.

At Step 420, bundle status circuits in the daisy chain are selected via the selection signals (e.g. $YA_0$, $YA_1$, $YA_2$, $YA_n$, FIG. 1), such that a bundle-level status value stored in the first latch in a bundle status circuit can determine whether the pass gate in the bundle status circuit can pass an input signal level to the output of the bundle status circuit. At Step 430, a detection signal (e.g. DetI, FIG. 1), such as at logic high, is applied at an input of the bundle status circuit starting the daisy chain (e.g. 170, FIG. 1). At Step 440, it is determined whether the output of the daisy chain indicates the detection of a bundle having at least one bit with the first status.

If the output does not indicate the detection, and the current tier is the last tier, then the processing ends (Step 470→Yes). If the output does not indicate the detection, and the current tier is not the last tier, then the daisy chain is initialized with bundle-level status values of corresponding bundles in a next tier in the buffer structure (Step 470→No, then Step 410).

If the output indicates the detection (Step 440→Yes), then at Step 450, a count of bundle status circuits indicating the first status (e.g. a fail status) is incremented. At Step 460, at the end of a cycle, a bundle status circuit indicating the first status is cleared since the output of the daisy chain indicates detection of a bundle in the first status in the cycle, indicating the bundle status circuit has been processed. At Step 430, another cycle in the same tier is started.

Figure 5:
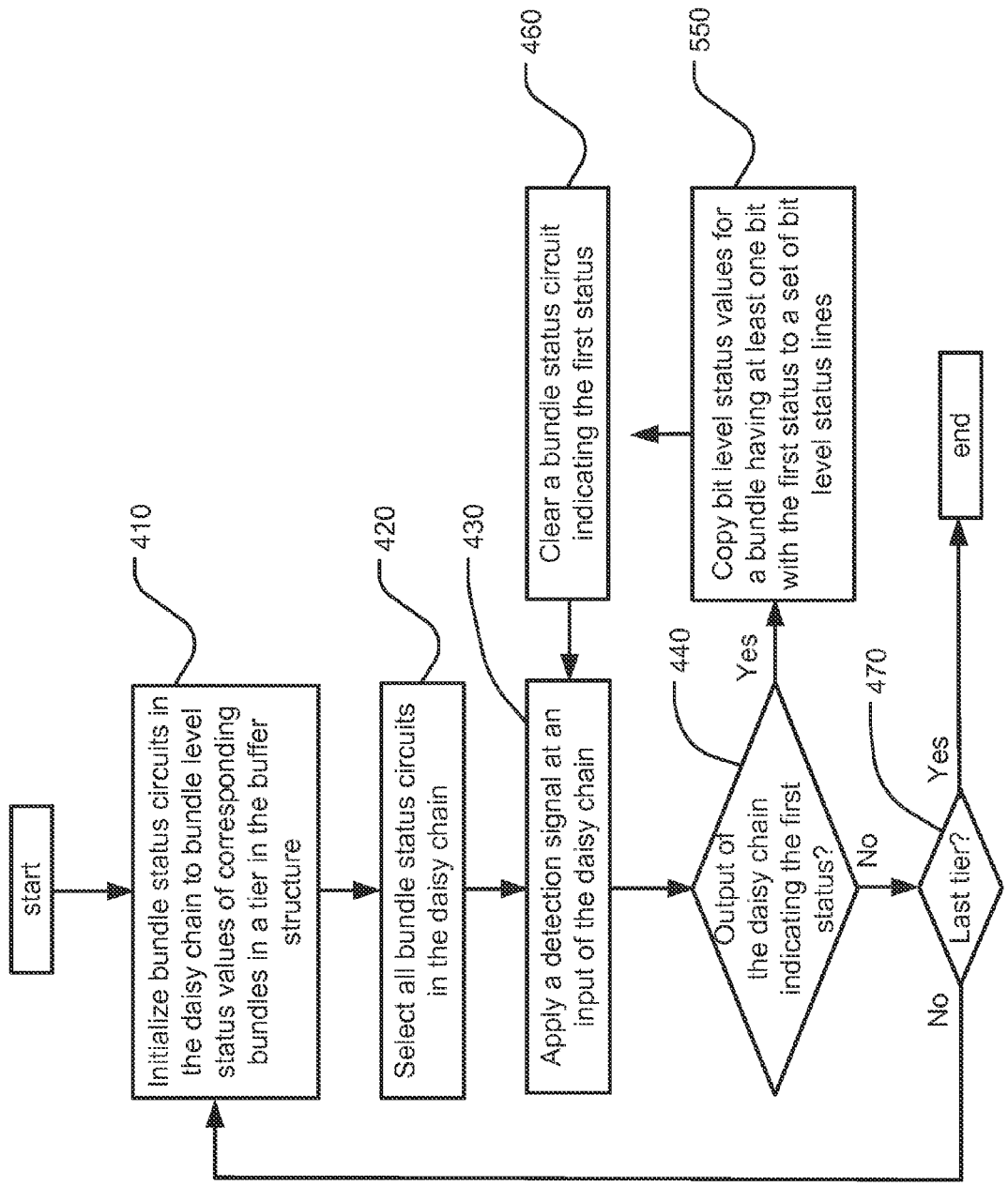
FIG. 5 is a flow chart for identifying storage elements in the buffer structure within a bundle having the first status.

FIG. 5 is a flow chart for identifying storage elements in the buffer structure within a bundle having the first status, in an integrated circuit memory as described in connection with FIG. 1. Like elements in FIGS. 4 and 5 are commonly referred to with like reference numerals. Like elements in FIG. 5 that are described in FIG. 4 include Steps 410-440, and 460-470, and description is generally not repeated for like elements in FIG. 5.

At Step 440, it is determined whether the output of the daisy chain indicates the detection of a bundle having at least one bit with the first status. If the output does not indicate the detection, and the current tier is the last tier, then the processing ends (Step 470→Yes). If the output does not indicate the detection, and the current tier is not the last tier, then the daisy chain is initialized with bundle-level status values of corresponding bundles in a next tier in the buffer structure (Step 470→No, then Step 410).

If the output indicates the detection (Step 440→Yes), then at Step 550, bit-level status values for a bundle having at least one bit with the first status are copied to a set of bit-level status lines (e.g. FBIT[7:0], FIG. 2) via a data bus (e.g. DBUS[7:0], FIG. 2). Consequently, storage elements in the buffer structure within the bundle having the first status can be identified and counted via the set of bit-level status lines.

At Step 460, at the end of a cycle, a bundle status circuit indicating the first status is cleared since the output of the daisy chain indicates detection of a bundle in the first status in the cycle, indicating the bundle status circuit has been processed. At Step 430, another cycle in the same tier is started.

Figure 6:
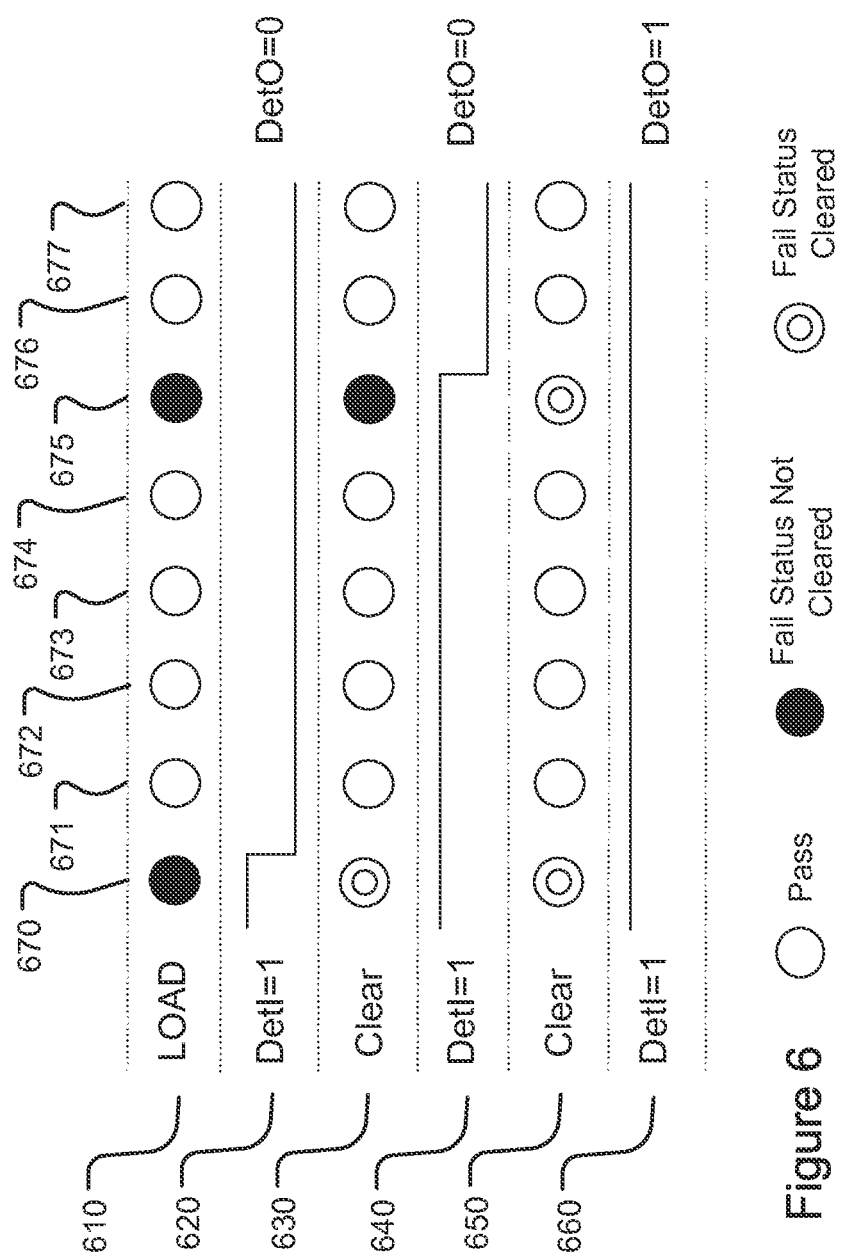
FIG. 6 is a diagram showing executing cycles to determine the output of the daisy chain, corresponding to the flow charts in FIGS. 4 and 5.

FIG. 6 is a diagram showing executing cycles to determine the output of the daisy chain, corresponding to the flow charts in FIGS. 4 and 5. As illustrated in the example of FIG. 6, columns 670-677 represent a plurality of bundle status circuits, such as bundle status circuits 170 171, 172 and 179 in FIG. 1, arranged as a daisy chain. The daisy chain starts at a bundle status circuit at column 670 and ends at a bundle status circuit at column 677. Bundle status circuits in the daisy chain are selected via selection signals (e.g. $YA_0$, $YA_1$, $YA_2$, $YA_n$, FIG. 1), such that a bundle-level status value stored in the first latch in a bundle status circuit can determine whether the pass gate in the bundle status circuit can pass an input signal to the output of the bundle status circuit.

At Step 610, in response to a high pulse on the signal LOAD (FIG. 2A), the bundle status circuits are initialized to status values for bundles of storage elements in a tier in the plurality of storage elements in the buffer structure. In this example, the bundle status circuits at columns 670 and 675 are initialized to the first status (e.g. a fail status), as indicated by a solid black circle. Bundle status circuits at other columns are initialized to the second status (e.g. a pass status), as indicated by a single circle.

At Step 620, a detection signal (e.g. DetI) at logic high is applied at an input of the bundle status circuit at column 670 (e.g. DetI=1). Since the bundle status circuit at column 670 is initialized to the fail status, the pass gate in the bundle status circuit at column 670 (e.g. 230, FIG. 2) is turned off and transistor 237 (FIG. 2) is turned on, providing logic low to the output of the bundle status circuit at column 670. Since the bundle status circuits at columns 671-674 are initialized to the pass status, the pass gates therein are turned on, passing the low signal level at the output of the bundle status circuit at column 670 through to the output at the bundle status circuit at column 674.

Since the bundle status circuit at column 675 is initialized to the fail status, the pass gate in the bundle status circuit at column 675 (e.g. 230, FIG. 2) is turned off and transistor 237 (FIG. 2) is turned on, providing logic low to the output of the bundle status circuit at column 675. Since the bundle status circuits at columns 676-677 are initialized to the pass status, the pass gates therein are turned on, passing logic low at the output of the bundle status circuit at column 675 through to the output of the bundle status circuit at column 677. Logic low is then detected at the output of the bundle status circuit at column 677 (e.g. DetO=0), indicating that at least one of the bundle status circuits at columns 670-677 indicates the fail status.

In reference to Step 450 in FIG. 4, in response to detecting logic low at the output of the bundle status circuit at column 677, a count of bundle status circuits indicating the first status (e.g. the fail status) is incremented.

In reference to Step 550 in FIG. 5, in response to detecting logic low at the output of the bundle status circuit at column 677, an enable signal is applied to enable inputs of the bundle status circuits in the daisy chain (e.g. FBIT_EN, FIG. 2). Consequently, circuitry 250 (FIG. 2) in the bundle status circuit at column 670 copies bit-level status values stored in a respective bundle in the buffer structure via a data bus (e.g. DBUS[7:0]) to a set of bit-level status lines (e.g. FBIT[7:0]).

At Step 630, first and second clear signals (e.g. TRC, TRC_2, FIG. 2) are applied to clear the first latch in the bundle status circuit at column 670 of the fail status, storing the second status in the bundle status circuit at column 670 thereby indicating that the fail status initialized to the bundle status circuit at column 670 has been processed, as shown by a double circle. Therefore, subsequent cycles will not re-process the fail status initialized to the bundle status circuit at column 670.

At Step 640, a detection signal (e.g. DetI) at logic high is applied at the input of the bundle status circuit at column 670 (e.g. DetI=1). Since the bundle status circuit at column 675 is initialized to the fail status, the pass gate in the bundle status circuit at column 675 (e.g. 230, FIG. 2) is turned off and transistor 237 (FIG. 2) is turned on, providing logic low to the output of the bundle status circuit at column 675. Since the bundle status circuits at columns 676-677 are initialized to the pass status, the pass gates therein are turned on, passing logic low at the output of the bundle status circuit at column 675 through to the output at the bundle status circuit at column 677.

Logic low is then detected at the output of the bundle status circuit at column 677 (e.g. DetO=0), indicating that at least one of the bundle status circuits at columns 670-677 indicates the fail status.

In reference to Step 450 in FIG. 4, in response to detecting logic low at the output of the bundle status circuit at column 677, a count of bundle status circuits indicating a first status (e.g. a fail status) is incremented.

In reference to Step 550 in FIG. 5, in response to detecting logic low at the output of the bundle status circuit at column 677, an enable signal is applied to enable inputs of the bundle status circuits in the daisy chain (e.g. FBIT_EN, FIG. 2). Consequently, circuitry 250 (FIG. 2) in the bundle status circuit at column 675 copies bit-level status values stored in a respective bundle in the buffer structure via a data bus (e.g. DBUS[7:0]) to a set of bit-level status lines (e.g. FBIT[7:0]).

At Step 650, first and second clear signals (e.g. TRC, TRC_2, FIG. 2) are applied to clear the first latch in the bundle status circuit indicating the first status at column 675 of the fail status, storing the second status in the bundle status circuit at column 675 thereby indicating that the fail status initialized to the bundle status circuit at column 675 has been processed, as shown by a double circle. Therefore, subsequent cycles will not re-process the fail status initialized to the bundle status circuit at column 675.

At Step 660, a detection signal DetI at logic high is applied at the input of the bundle status circuit at column 670 (e.g. DetI=1). Since the bundle status circuits at columns 670 and 675 have been cleared from the initialized fail status to the pass status, the pass gates in the bundle status circuits at columns 670 and 675 (e.g. 230, FIG. 2) are turned on, passing logic high applied at the input of the bundle status circuit at column 670 through to the output of the bundle status circuit at column 677 (e.g. DetO=1), and completing the processing of the bundle status circuits in the daisy chain.

Figure 7:
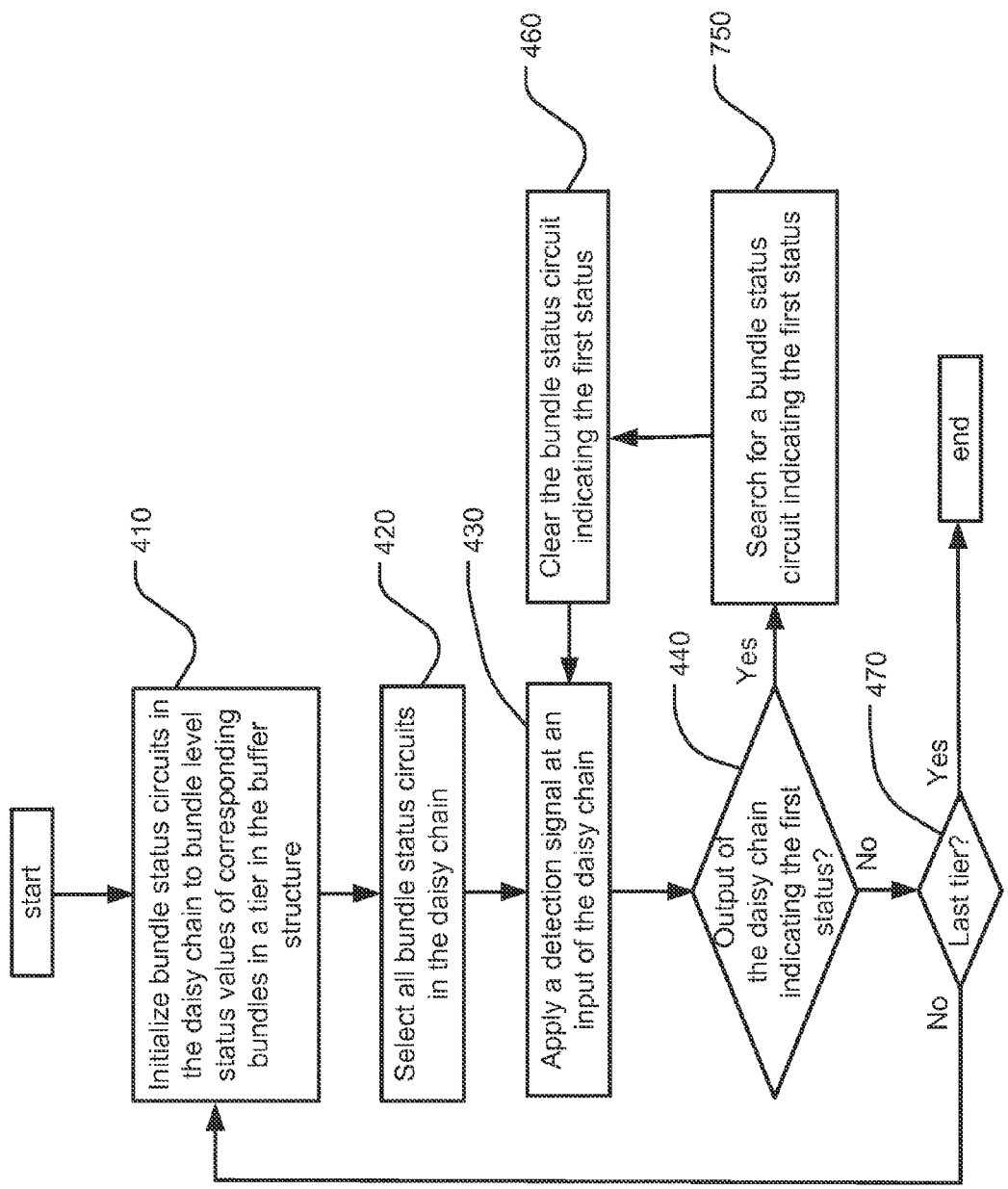
FIG. 7 is a flow chart for searching for bundle status circuits indicating the first status.

FIG. 7 is a flow chart for searching for bundle status circuits indicating the first status, in an integrated circuit memory as described in connection with FIG. 1. Like elements in FIGS. 4 and 7 are commonly referred to with like reference numerals. Like elements in FIG. 7 that are described in FIG. 4 include Steps 410-450, and 470-480, and description is generally not repeated for like elements in FIG. 7.

At Step 440, it is determined whether the output of the daisy chain indicates the detection of a bundle having at least one bit with the first status. If the output does not indicate the detection, and the current tier is the last tier, then the processing ends (Step 470→Yes). If the output does not indicate the detection, and the current tier is not the last tier, then the daisy chain is initialized with bundle-level status values of corresponding bundles in a next tier in the buffer structure (Step 470→No, then Step 410).

If the output indicates the detection (Step 440→Yes), then at Step 750, a search is executed for a bundle status circuit indicating the first status. The search can utilize the selection signals (e.g. $YA_0$, $YA_1$, $YA_2$, $YA_n$, FIG. 1) to successively narrow search ranges until a bundle status circuit indicating the first status is found. Further description of the search is provided in connection with FIG. 8.

At Step 460, at the end of a cycle, a bundle status circuit indicating the first status is cleared since the output of the daisy chain indicates detection of a bundle in the first status in the cycle, indicating the bundle status circuit has been processed. At Step 430, another cycle in the same tier is started.

Figure 8:
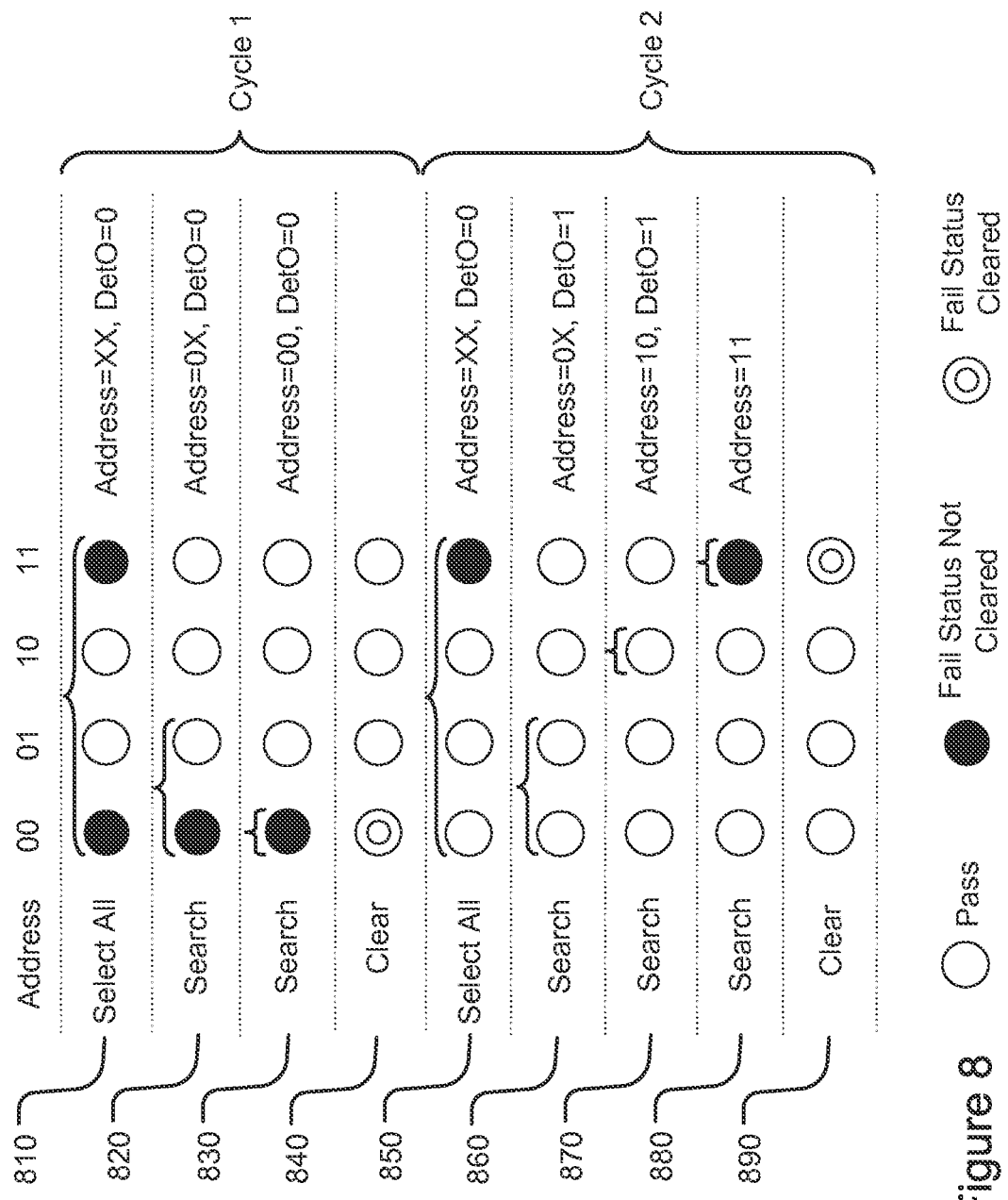
FIG. 8 is a diagram showing executing cycles to search for bundle status circuits indicating the first status, corresponding to the flow chart in FIG. 7.

FIG. 8 is a diagram showing executing cycles to search for bundle status circuits indicating the first status, corresponding to the flow chart in FIG. 7. A plurality of bundle status circuits is arranged in a daisy chain. As illustrated in the example of FIG. 8, the daisy chain includes four bundle status circuits at addresses=00, 01, 10 11 (e.g. 195, FIG. 1), starting at a bundle status circuit at address=00 and ending at a bundle status circuit at address 11. In one implementation, a binary search is used. In the binary search, a bundle status circuit indicating the first status can be found in $\log_2 N$ steps, where N is the number of bundle status circuits initialized with bundle-level status values in the daisy chain. Although N=4 in the example of FIG. 8, N can be greater than 4, such as 64, 128, 256, etc.

At Step 810, the bundle status circuits at Address=00 and Address=11 are initialized to the fail status, while the other bundle status circuits are initialized to the pass status. Each cycle in the search operation can find one bundle status circuit initialized to the fail status, and consequently, two cycles (e.g. Cycle 1, Cycle 2) are needed to find both bundle status circuits initialized to the fail status.

For Cycle 1, at Step 810, all bundle status circuits are selected, as indicated by "Address=XX", where an "X" means either "0" or "1" so "XX" refers to four addresses 00, 01, 10 and 11. Consequently, the bundle status circuits at Address=00 and Address=11 initialized to the fail status block respective input signals from being passed to respective outputs of the bundle status circuits. When a detection signal (e.g. DetI, FIG. 1) at logic high is applied at the input of the bundle status circuit at Address=00, the detection signal is blocked from being passed through the bundle status circuits in the daisy chain. Consequently, logic low is detected at the output of the bundle status circuit at Address=11 (e.g. DetO=0), indicating at least one of the four bundle status circuits is initialized to the fail status.

At Step 820, to narrow the search range of four bundle status circuits, two bundle status circuits are selected, as indicated by "Address=0X", where "0X" refers to addresses "00" and "01". Unselected bundle status circuits pass respective input signals through respective outputs of the bundle status circuits, independent of the status values stored in the unselected bundle status circuits. When a detection signal (e.g. DetI, FIG. 1) at logic high is applied at the input of the bundle status circuit at Address=00, the detection signal is blocked from being passed through the bundle status circuits in the daisy chain. Consequently, logic low is detected at the output of the bundle status circuit at Address=11 (e.g. DetO=0), indicating at least one of the two bundle status circuits is initialized to the fail status.

At Step 830, to further narrow the search range of two bundle status circuits, one bundle status circuit is selected, as indicated by "Address=00". Unselected bundle status circuits pass respective input signals through respective outputs of the bundle status circuits, independent of the status values stored in the unselected bundle status circuits. When a detection signal (e.g. DetI, FIG. 1) at logic high is applied at the input of the bundle status circuit at Address=00, the detection signal is blocked from being passed through the bundle status circuits in the daisy chain. Consequently, logic low produced by the output of the bundle status circuit at Address=00 is passed through other bundle status circuits in the daisy chain, and detected at the output of the bundle status circuit at Address=11 (e.g. DetO=0), indicating the bundle status circuit at "Address=00" is initialized to the fail status.

At Step 840, first and second clear signals (e.g. TRC, TRC_2, FIG. 2) are applied to clear the bundle status circuit at Address=00, storing the second status in the bundle status circuit at Address=00 thereby indicating that the fail status initialized to the bundle status circuit at Address=00 has been processed, as shown by a double circle. Therefore, subsequent cycles will not re-process the fail status initialized to the bundle status circuit at Address=00.

For Cycle 2, at Step 850, all bundle status circuits are selected. Consequently, the bundle status circuit initialized to the fail status at Address=11 blocks an input signal from being passed to an output of the bundle status circuit at Address=11. When a detection signal (e.g. DetI, FIG. 1) at logic high is applied at the input of the bundle status circuit at Address=00, the detection signal is passed through to the input of the bundle status circuit at Address=11. Since the bundle status circuit at Address=11 is initialized to the fail status, the detection signal is blocked from being passed to the output. Consequently, logic low is detected at the output of the bundle status circuit at Address=11 (e.g. DetO=0), indicating at least one of the four bundle status circuits is initialized to the fail status.

At Step 860, to narrow the search range of four bundle status circuits, two bundle status circuits are selected, as indicated by "Address=0X", where "0X" refers to addresses "00" and "01". Unselected bundle status circuits pass respective input signals through respective outputs of the bundle status circuits, independent of the status values stored in the unselected bundle status circuits. When a detection signal (e.g. DetI, FIG. 1) at logic high is applied at the input of the bundle status circuit at Address=00, the detection signal is passed to the output of the bundle status circuit at Address=11 (e.g. DetO=1), indicating that neither of the two bundle status circuits at Address=0X is initialized to the fail status, and that therefore at least one of the two other bundle status circuits at Address=1X is initialized to the fail status.

At Step 870, one bundle status circuit at Address=10 is selected. When a detection signal (e.g. DetI, FIG. 1) at logic high is applied at the input of the bundle status circuit at Address=00, the detection signal is passed to the output of the bundle status circuit at Address=11 (e.g. DetO=1), indicating that the bundle status circuit at Address=10 is not initialized to the fail status, and that therefore the bundle status circuit at Address=11 may be initialized to the fail status.

At Step 880, one bundle status circuit at Address=11 is selected. When a detection signal (e.g. DetI, FIG. 1) at logic high is applied at the input of the bundle status circuit at Address=00, the detection signal is blocked by the bundle status circuit at Address=11, indicating that the bundle status circuit at Address=11 is initialized to the fail status.

At Step 890, first and second clear signals (e.g. TRC, TRC_2, FIG. 2) are applied to clear the bundle status circuit at Address=11, storing the second status in the bundle status circuit at Address=11 thereby indicating that the fail status initialized to the bundle status circuit at Address=11 has been processed, as shown by a double circle. Therefore, subsequent cycles will not re-process the fail status initialized to the bundle status circuit at Address=11.

Figure 9:
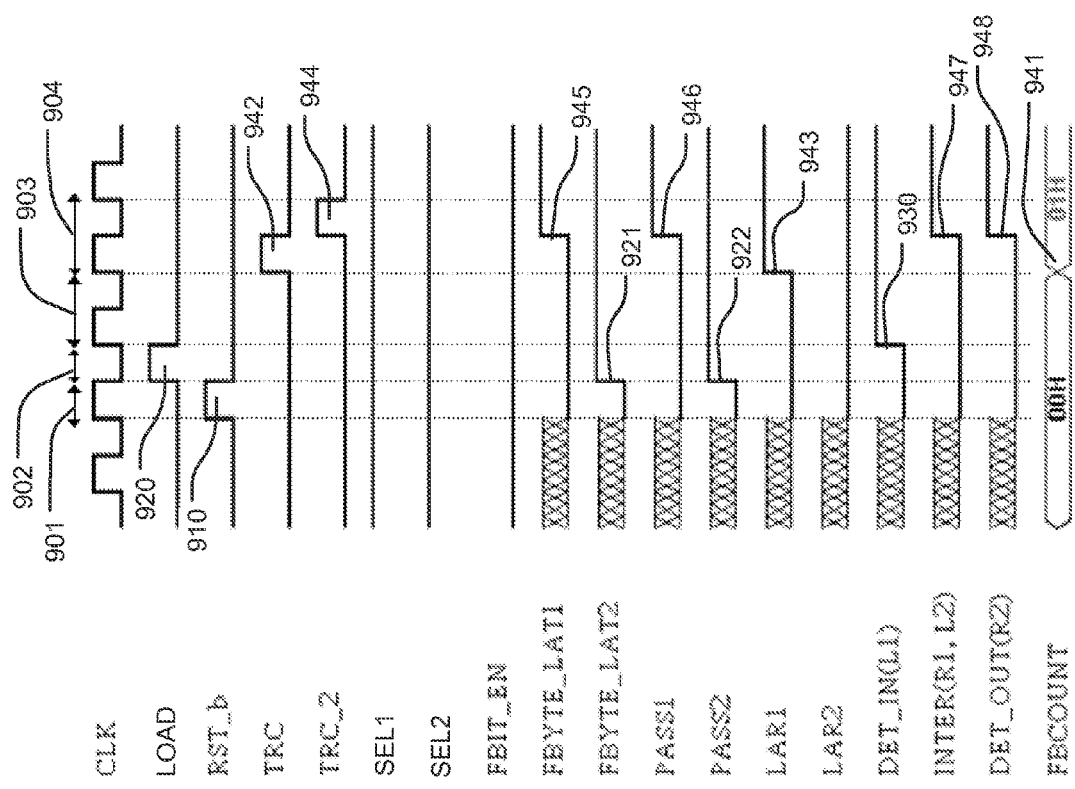
FIG. 9 is a timing diagram for keeping count of bundle status circuits indicating the first status, using the example daisy chain as shown in FIG. 3.

FIG. 9 is a timing diagram for keeping count of bundle status circuits indicating the first status, using the example daisy chain as shown in FIG. 3. The example daisy chain includes two bundle status circuits 310 and 320 coupled in series. Bundle status circuit 310 has an input L1 at which a detection signal DET_IN is applied, and an output R1. Bundle status circuit 320 has an input L2 coupled to the output R1 of the bundle status circuit 310 via a signal INTER, and an output R2 coupled to an output detection signal DET_OUT.

The timing diagram shows signal transitions for signals in the example daisy chain between logic high and logic low. The example of FIG. 9 assumes that the bundle status circuit 310 is coupled to a first bundle in the buffer structure storing the first status in at least one of the storage elements in the first bundle, and that the bundle status circuit 320 is coupled to a second bundle in the buffer structure storing the first status in none of the storage elements in the second bundle.

Signals at logic high are applied at selection inputs SEL1 and SEL2 to select the bundle status circuits 310 and 320, such that a bundle-level status value stored in the first latch in a bundle status circuit can determine whether the pass gate in the bundle status circuit can pass an input signal to the output of the bundle status circuit. Enable input FBIT_EN remains at logic low for the example of FIG. 9.

As illustrated in the example of FIG. 9, time periods (e.g. 901-904) are defined by clock cycles on a clock signal CLK. For instance, the time period 901 and the time period 902 are within a first clock cycle, the time period 901 starting at the rising edge of the first clock cycle and ending at the falling edge within the first clock cycle, while the time period 902 starting at the falling edge of the first clock cycle and ending at the end of the first clock cycle. The time period 903 extends through a second clock cycle subsequent to the first clock cycle, and a fourth period 904 extends through a third clock cycle subsequent to the second clock cycle.

In the time period 901, a high pulse 910 is applied to the reset signal RST_b, resetting the first and second latches in the bundle status circuits 310 and 320. Consequently, signal FBYTE_LAT1 at the output of the first latch and signal LAR1 at the output of the second latch in the bundle status circuit 310 are at logic low in the time period 901. Likewise, signal FBYTE_LAT2 at the output of the first latch and signal LAR2 at the output of the second latch in the second circuit 320 are at logic low in the time period 901.

In the time period 902, a high pulse 920 on signal LOAD (FIG. 2) causes initialization of the bundle status circuit 310 to the fail status, as shown by logic low for signal FBYTE_LAT1. The high pulse 920 also causes initialization of the second circuit 320 to the pass status, as shown by logic high for signal FBYTE_LAT2, after a transition 921 from logic low to logic high. Since the selection input SEL 2 is at logic high and the first latch in the bundle status circuit 320 is initialized to logic high, signal PASS2 transitions from logic low to logic high (e.g. 922), turning on the pass gate in the bundle status circuit 320.

In the time period 903, the detection signal DET_IN transitions from logic low to logic high (e.g. 930). Since the bundle status circuit 310 is initialized to the fail status at logic low, the pass gate in the bundle status circuit 310 is turned off and the detection signal is not passed through to the bundle status circuit 320. Consequently, signals INTER (R1, L2) and DET_OUT (R2) remain at logic low, indicating a bundle status circuit indicating a fail status has been detected.

In the time period 904, since the detection signal DET_IN is at logic high and the output detection signal DET_OUT is at logic low, a count of bundle status circuits indicating the first status (e.g. FBCOUNT) is incremented from 0 to 1, as indicated by the transition from hexadecimal numbers 00H to 01H (e.g. 941).

In the time period 904, a high pulse 942 is applied to the first clear signal TRC, changing the state of the second latch in the bundle status circuit 310 since the input L1 is at logic high, as indicated by transition 943 for signal LAR1, and keeping the state of the second latch in the bundle status circuit 320 since the input L2 is at logic low, as indicated by no change for signal LAR2.

In the time period 904, subsequent to the high pulse 942, a high pulse 944 is applied to the second clear signal TRC_2, clearing the first latch in the bundle status circuit 310 of the fail status by storing the pass status corresponding to logic high, as indicated by transition 945 for signal FBYTE_LAT1. Consequently, signal PASS1 transitions from logic low to logic high (e.g. 946), turning on the pass gate in the bundle status circuit 310, and causing the detection signal at logic high to be passed to the output R1 of the bundle status circuit 310 (e.g. 947), and then to the output R2 of the bundle status circuit 320 (e.g. 948). Since the output detection signal DET_OUT is at logic high, indicating that all bundle status circuits initialized to the fail status in the daisy chain have been processed, the processing ends.

Figure 10:
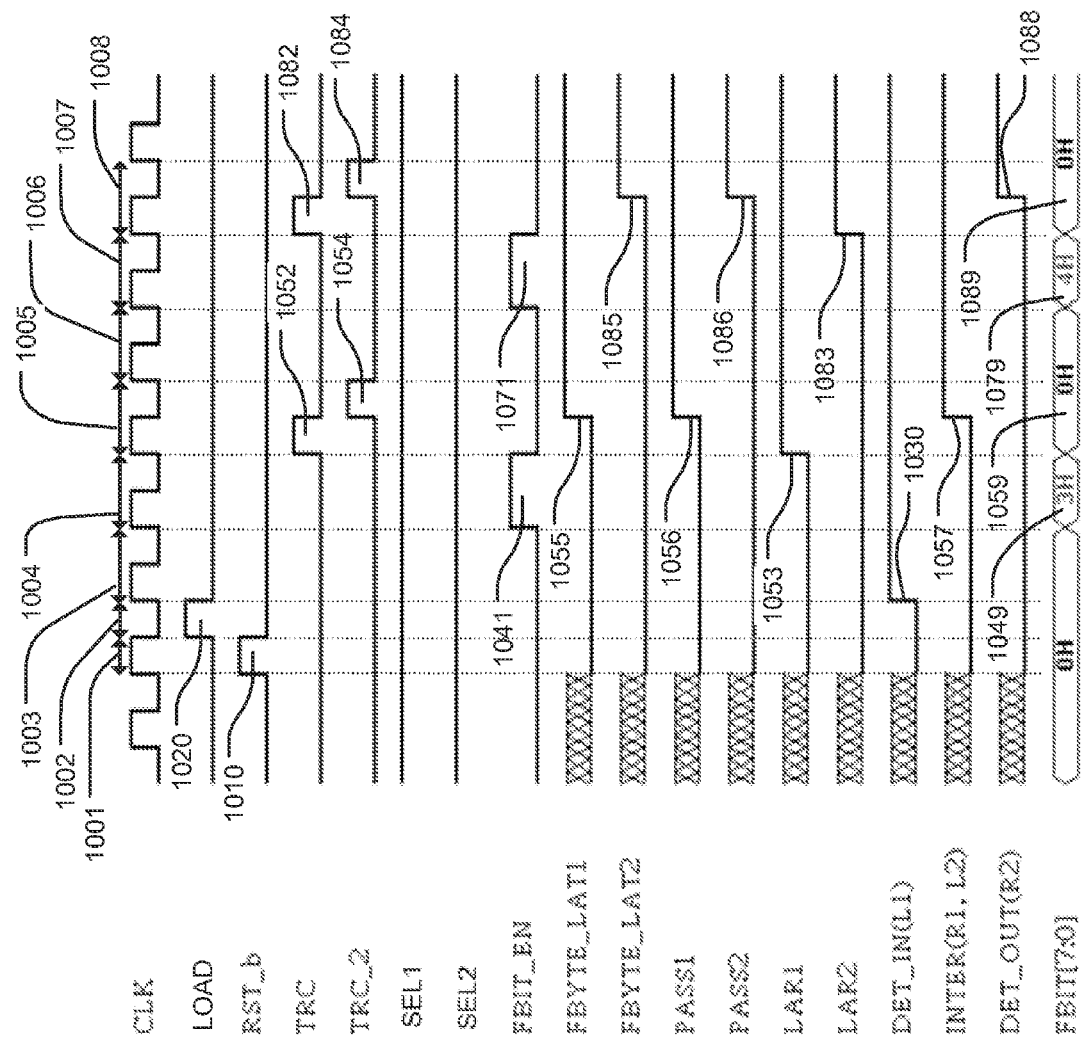
FIG. 10 is a timing diagram for identifying storage elements in the buffer structure within a bundle having the first status, using the example daisy chain as shown in FIG. 3.

FIG. 10 is a timing diagram for identifying storage elements in the buffer structure within a bundle having the first status, using the example daisy chain as shown in FIG. 3. The example daisy chain includes two bundle status circuits 310 and 320 coupled in series. Bundle status circuit 310 has an input L1 at which a detection signal DET_IN is applied, and an output R1. Bundle status circuit 320 has an input L2 coupled to the output R1 of the bundle status circuit 310 via a signal INTER, and an output R2 coupled to an output detection signal DET_OUT.

The timing diagram shows signal transitions for signals in the daisy chain between logic high and logic low. The example of FIG. 10 assumes that the bundle status circuit 310 is coupled to a first bundle in the buffer structure storing the first status in three of the storage elements in the first bundle, and that the bundle status circuit 320 is coupled to a second bundle in the buffer structure storing the first status in four of the storage elements in the second bundle.

Signals at logic high are applied at selection inputs SEL1 and SEL2 to select the bundle status circuits 310 and 320, such that a bundle-level status value stored in the first latch in a bundle status circuit can determine whether the pass gate in the bundle status circuit can pass an input signal level to the output of the bundle status circuit.

In the example of FIG. 10, time periods 1001-1008 are illustrated. In the time period 1001, latches in the example daisy chain are reset. In the time period 1002, bundle status circuits 310 and 320 are initialized according to bit-level status values stored in the first bundle of storage elements and the second bundle of storage elements. In a first cycle including the time periods 1003-1005, the bundle status circuit 310 is processed. In a second cycle including the time periods 1006-1008, the bundle status circuit 320 is processed. Cycles like the first cycle and the second cycle can be repeated until all bundle status circuits initialized to the fail status in the daisy chain have been processed.

In the time period 1001, a high pulse 1010 is applied to the reset signal RST_b, resetting the first and second latches in the bundle status circuits 310 and 320. Consequently, signal FBYTE_LAT1 at the output of the first latch and signal LAR1 at the output of the second latch in the bundle status circuit 310 are at logic low. Likewise, signal FBYTE_LAT2 at the output of the first latch and signal LAR2 at the output of the second latch in the second circuit 320 are at logic low in the time period 1001.

In the time period 1002, a high pulse 1020 on signal LOAD (FIG. 2) causes initialization of the bundle status circuits 310 and 320 to the fail status, as shown by logic low for signals FBYTE_LAT1 and FBYTE_LAT2. Consequently, signals PASS1 and PASS2 remain at logic low, pass gates in the bundle status circuits 310 and 320 are turned off, and outputs R1 and R2 remain at logic low.

In the time period 1003, the detection signal DET_IN transitions from logic low to logic high (e.g. 1030). Since the bundle status circuit 310 is initialized to the fail status at logic low, the pass gate in the bundle status circuit 310 is turned off, blocking the detection signal, and a transistor 248_1 in the bundle status circuit 310 is turned on, providing logic low to the output of the bundle status circuit 310 (e.g. INTER(R1, L2)). Since the bundle status circuit 320 is initialized to the fail status at logic low, the pass gate in the bundle status circuit 320 is turned off, blocking the output of the bundle status circuit 310 whether it is at logic low or logic high, and a transistor 248_2 in the bundle status circuit 320 is turned on, providing logic low to the output of the bundle status circuit 320 (e.g. DET_OUT(R2)). Consequently, signal DET_OUT (R2) remain at logic low at the output of the bundle status circuit 320, indicating a bundle status circuit that indicates a fail status has been detected.

In the time period 1004, since the detection signal DET_IN is at logic high and the output detection signal DET_OUT is at logic low, a high pulse (e.g. 1041) is applied at the enable input (e.g. FBIT_EN, FIG. 3 and FIG. 10), and consequently bit-level status values stored in the first bundle of storage elements, including three storage elements indicating the first status, are copied via a data bus (e.g. DBUS1[7:0], FIG. 3) to a set of bit-level status lines (e.g. FBIT[7:0], FIG. 3 and FIG. 10), as indicated by the transition from hexadecimal numbers 0H to 3H (e.g. 1049).

In the time period 1005, a high pulse 1052 is applied to the first clear signal TRC, changing the state of the second latch in the bundle status circuit 310 since the input L1 is at logic high, as indicated by transition 1053 from logic low to logic high for signal LAR1, and keeping the state of the second latch in the bundle status circuit 320 since the input L2 is at logic low, as indicated by no change for signal LAR2. The high pulse (e.g. 1041) applied at the enable input (e.g. FBIT_EN) ends at the start of the time period 1005, and consequently data values on the set of bit-level status lines (e.g. FBIT[7:0]) are changed to logic low, as indicated by the transition from hexadecimal numbers 3H to 0H (e.g. 1059).

In the time period 1005, subsequent to the high pulse 1052, a high pulse 1054 is applied to the second clear signal TRC_2 to clear the first latch in the bundle status circuit 310, storing the second status in the bundle status circuit 310 thereby indicating that the fail status initialized to the bundle status circuit 310 has been processed, as shown by transition 1055 for signal FBYTE_LAT1. Consequently, signal PASS1 transitions from logic low to logic high (e.g. 1056), turning on the pass gate in the bundle status circuit 310, and causing the detection signal at logic high to be passed to the output R1 of the bundle status circuit 310 (e.g. 1057). Since the signal PASS2 is at logic low, the pass gate in the bundle status circuit 320 is turned off, and the output R2 of the bundle status circuit 320 remains at logic low.

In the time period 1006, the detection signal DET_IN at logic high is passed to the input L2 of the bundle status circuit 320. Since the bundle status circuit 320 is initialized to the fail status at logic low, the pass gate in the bundle status circuit 320 is turned off and the detection signal at logic high is not passed through to the output of the bundle status circuit 320. Consequently, signal DET_OUT (R2) remain at logic low at the output of the bundle status circuit 320, indicating a bundle status circuit storing a fail status has been detected.

In the time period 1007, since the detection signal DET_IN is at logic high and the output detection signal DET_OUT is at logic low, a high pulse (e.g. 1071) is applied at the enable input (e.g. FBIT_EN, FIG. 3 and FIG. 10), and consequently bit-level status values stored in the second bundle of storage elements, including four storage elements storing the first status, are copied via a data bus (e.g. DBUS2[7:0], FIG. 3) to the set of bit-level status lines (e.g. FBIT[7:0], FIG. 3 and FIG. 10), as indicated by the transition from hexadecimal numbers 0H to 4H (e.g. 1079).

In the time period 1008, a high pulse 1082 is applied to the first clear signal TRC, changing the state of the second latch in the bundle status circuit 320 since the input L2 is at logic high, as indicated by transition 1083 from logic low to logic high for signal LAR2. The high pulse (e.g. 1071) applied at the enable input (e.g. FBIT_EN) ends at the start of the time period 1008, and consequently bit-level data values on the set of bit-level status lines (e.g. FBIT[7:0]) are changed to logic low, as indicated by the transition from hexadecimal numbers 4H to 0H (e.g. 1089).

In the time period 1008, subsequent to the high pulse 1082, a high pulse 1084 is applied to the second clear signal TRC_2 to clear the first latch in the bundle status circuit 320, storing the second status in the bundle status circuit 320 thereby indicating that the fail status initialized to the bundle status circuit 320 has been processed, as shown by transition 1085 for signal FBYTE_LAT2. Consequently, signal PASS2 transitions from logic low to logic high (e.g. 1086), turning on the pass gate in the bundle status circuit 320, and causing the detection signal at logic high to be passed to the output R2 of the bundle status circuit 320 (e.g. 1088). Since the output detection signal DET_OUT is at logic high, indicating that all bundle status circuits initialized to the fail status in a plurality of bundle status circuits have been processed, the processing ends.

Figure 11:
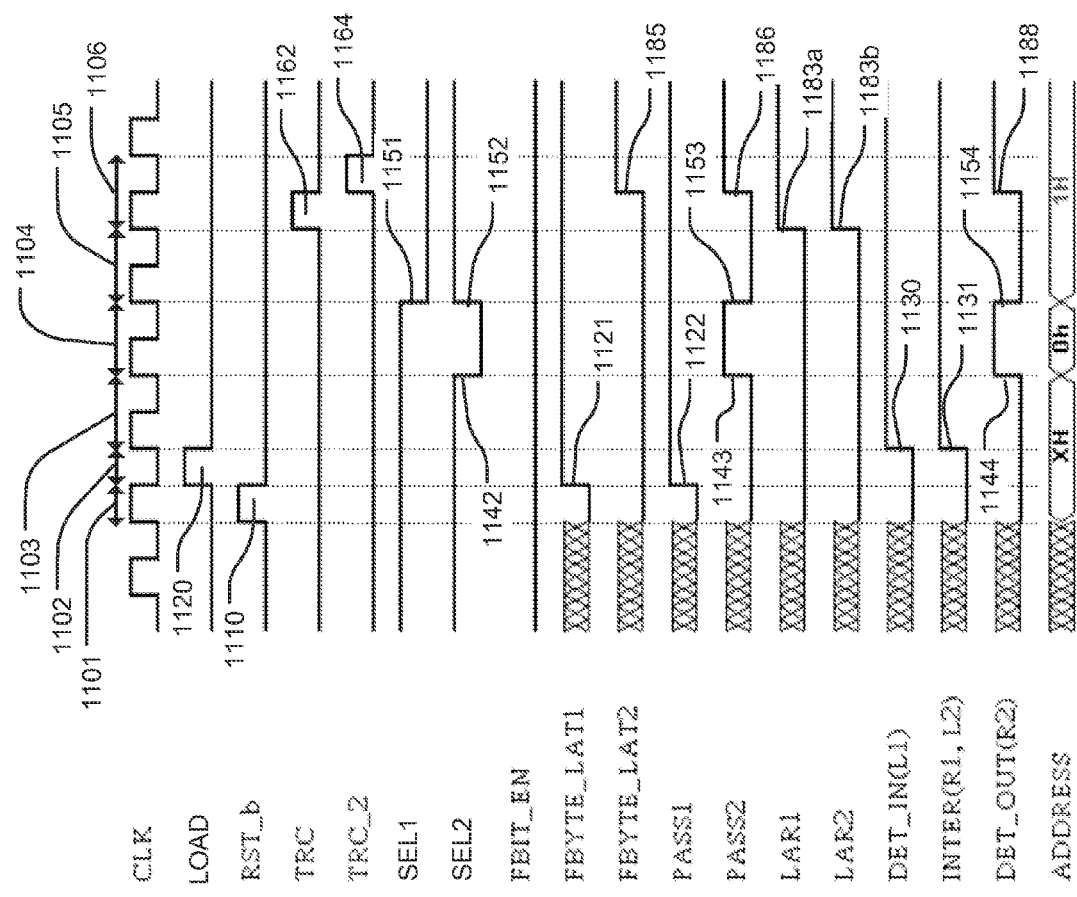
FIG. 11 is a timing diagram for searching for bundle status circuits indicating the first status, using the example daisy chain as shown in FIG. 3.

FIG. 11 is a timing diagram for searching for bundle status circuits indicating the first status, using the example daisy chain as shown in FIG. 3. The timing diagram shows signal transitions for signals in the daisy chain between logic high and logic low in time periods 1101-1106. The example of FIG. 11 assumes the pass status and the fail status for the bundle status circuits 310 and 320, respectively. Enable input FBIT_EN remains at logic low for the example of FIG. 11.

As illustrated in the example of FIG. 11, a binary search is used. In the binary search, a bundle status circuit indicating the first status can be found in $\log_2 N$ steps, where N is the number of bundle status circuits in the daisy chain. Although N=2 in the example of FIG. 11, N can be greater than 2, such as 32, 64, 128, 256, etc.

In time periods 1101, 1102 and 1103, signals at logic high are applied at selection inputs SEL1 and SEL2 to configure the bundle status circuits 310 and 320, such that a bundle-level status value stored in the first latch in a bundle status circuit can determine whether the pass gate in the bundle status circuit can pass an input signal level to the output of the bundle status circuit.

In subsequent time periods, signal levels are varied between logic high and logic low at selection inputs SEL1 and SEL2, such that bundle status circuits in a portion of the plurality of bundle status circuits are configured to pass input signal levels in response to status values stored in the bundle status circuits in the portion, while bundle status circuits outside the portion and in the plurality of bundle status circuits are configured to pass input signal levels through the bundle status circuits outside the portion independent of status values stored in the bundle status circuits outside the portion. Search for a bundle status circuit indicating the first status is then executed within the portion.

In the time period 1101, a high pulse 1110 is applied to the reset signal RST_b, resetting the first and second latches in the bundle status circuits 310 and 320. Consequently, signal FBYTE_LAT1 at the output of the first latch and signal LAR1 at the output of the second latch in the bundle status circuit 310 are at logic low in the time period 1101. Likewise, signal FBYTE_LAT2 at the output of the first latch and signal LAR2 at the output of the second latch in the second circuit 320 are at logic low in the time period 1001.

In the time period 1102, a high pulse 1120 on signal LOAD (FIG. 2) causes initialization of the bundle status circuits 310 to the pass status, as shown by transition from logic low to logic high for signal FBYTE_LAT1 (e.g. 1121). Consequently, signal PASS1 transitions from logic low to logic high (e.g. 1122). The high pulse 1120 causes initialization of the bundle status circuits 320 to the fail status, as shown by logic low for signal FBYTE_LAT2. Consequently signal PASS2 remains at logic low.

In the time period 1103, the detection signal DET_IN transitions from logic low to logic high (e.g. 1130). Since the bundle status circuit 310 is initialized to the pass status at logic high, the pass gate in the bundle status circuit 310 is turned on and the detection signal is passed to the output of the bundle status circuit 310. Consequently, signal INTER (R1, L2) transitions from logic low to logic high (e.g. 1131). Since bundle status circuit 320 is initialized to the fail status at logic low, signal INTER (R1, L2) at logic high is not passed to the output detection signal DET_OUT (R2), indicating at least one of bundle status circuits stores a fail status.

In the time period 1104, the search begins for a bundle status circuit indicating a fail status. The selection input SEL1 remains at logic high, while the signal at the selection input SEL2 transitions from logic high to logic low (e.g. 1142), selecting the bundle status circuit 310 at address 0H. Since the selection input SEL1 is at logic high, signal PASS1 transitions to logic high or logic low in response to the status value stored in the bundle status circuit 310. Consequently, the pass gate in the bundle status circuit 310 can pass an input signal level to the output of the bundle status circuit 310 in response to the status value stored in the bundle status circuit 310.

Since the selection input SEL2 is at logic low, signal PASS2 transitions from logic low to logic high (e.g. 1143), turning on the pass gate in the bundle status circuit 320 independent of the status value stored in the bundle status circuit 320. Consequently, the pass gate in the bundle status circuit 320 can pass an input signal level to the output of the bundle status circuit 320 independent of the status value stored in the bundle status circuit 320. Logic high at the input of the bundle status circuit 320 (INTER(R1, L2)) is passed to the signal DET_OUT (R2) at the output of the bundle status circuit 320 (e.g. 1144). Logic high at the signal DET_OUT (R2) indicates that the bundle status circuit 310 at address 0H does not store the fail status.

In the time period 1105, the search continues for a bundle status circuit storing a fail status. The signal at the selection input SEL1 transitions from logic high to logic low (e.g. 1151), while the signal at the selection input SEL2 transitions from logic low to logic high (e.g. 1152), selecting the bundle status circuit 320 at address 1H. Since the selection input SEL1 is at logic low, signal PASS1 remains at logic high, and signal INTER(R1, L2) remains at logic high at the output of the bundle status circuit 310 and the input of the bundle status circuit 320.

Since the selection input SEL2 is at logic high, signal PASS2 transitions from logic high or logic low in response to the fail status stored in the bundle status circuit 320 (e.g. 1153). Consequently, the pass gate in the bundle status circuit 320 is blocked from passing logic high at the signal INTER(R1, L2) to the output of the bundle status circuit 320. The signal DET_OUT (R2) transitions from logic high to logic low (e.g. 1154), indicating that the bundle status circuit 320 at address 1H stores the fail status.

In the time period 1106, a high pulse 1162 is applied to the first clear signal TRC, changing the state of the second latches in the bundle status circuits 310 and 320 since the inputs L1 and L2 are at logic high, as indicated by transitions from logic low to logic high for signals LAR1 and LAR2 (e.g. 1183a, 1183b).

Subsequent to the high pulse 1162, a high pulse 1164 is applied to the second clear signal TRC_2 to clear the first latch in the bundle status circuit 320, storing the second status in the bundle status circuit 320 thereby indicating that the fail status initialized to the bundle status circuit 320 has been processed, as shown by transition 1185 for signal FBYTE_LAT2. Consequently, signal PASS2 transitions from logic low to logic high (e.g. 1186), turning on the pass gate in the bundle status circuit 320, and causing the detection signal at logic high to be passed to the output of the bundle status circuit 320 (e.g. 1188). Since the output detection signal DET_OUT is at logic high, indicating that all bundle status circuits initialized to the fail status in a plurality of bundle status circuits have been processed, the processing ends.

Figure 12:
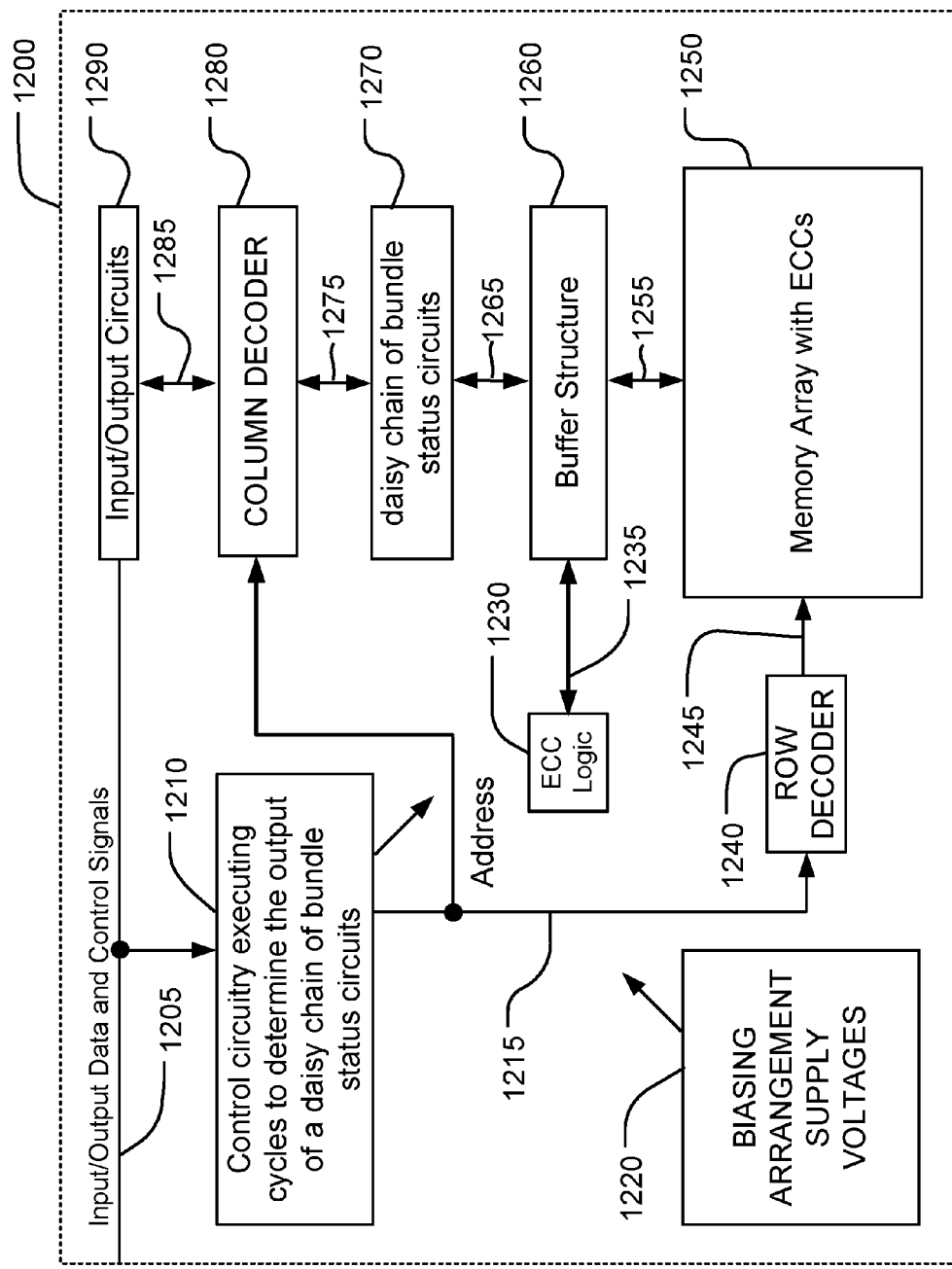
FIG. 12 is a simplified chip block diagram of an integrated circuit memory according to an embodiment.

FIG. 12 is a simplified chip block diagram of an integrated circuit memory according to an embodiment. The integrated circuit 1200 includes a memory array 1250 that stores data with ECCs, on an integrated circuit substrate.

A row decoder 1240 is coupled to a plurality of word lines 1245, and arranged along rows in the memory array 1250. A buffer structure 1260 is coupled to the memory array with ECCs 1250 via a plurality of bit lines 1255 arranged along columns in the memory array 1250 for reading data from and writing data to the memory array 1250. A daisy chain of bundle status circuits 1270 is coupled to the buffer structure 1260 via a plurality of data lines 1265. A column decoder 1280 is coupled to the daisy chain of bundle status circuits 1270 via a bus 1275. Input/output circuits 1290 are coupled to the column decoder 1280 via a data bus 1285. Addresses are supplied on bus 1215 from control logic 1210 to column decoder 1280, and row decoder 1240. The input/output circuits 1290 are coupled to the input/output data path.

The buffer structure 1260 includes a plurality of storage elements (e.g. 140-147, FIG. 1) to store bit-level status values for data lines in the plurality of data lines. The memory includes logic to indicate bundle-level status values of corresponding bundles of storage elements in the buffer structure based on the bit-level status values of bits in the corresponding bundles. The logic includes a plurality of bundle status circuits (e.g. 170) arranged in a daisy chain. The bundle status circuits are coupled to respective bundles in the buffer structure, and produce an output of the daisy chain indicating detection of a bundle in the first status. In operation, the buffer structure 1260 reads data from the memory array with ECCs 1250, and the daisy chain of bundle status circuits 1270 loads information about fail bits from the buffer structure. The column decoder is used at least in data input/output operations and in searching for a bundle status circuit indicating one or more fail bits.

The memory includes control circuitry (e.g. 1210) which executes cycles to determine the output of the daisy chain, each cycle clearing a bundle status circuit indicating the first status if the output indicates detection of a bundle in the first status in the cycle. The control circuitry repeats the cycles until the output indicates no bundle status circuits have the first status. The control circuitry keeps count of bundle status circuits indicating the first status during the cycles.

Input/output circuits 1290 drive the data to destinations external to the integrated circuit 1200. Input/output data and control signals are moved via data bus 1205 between the input/output circuits 1290, the control circuitry 1210 and input/output ports on the integrated circuit 1200 or other data sources internal or external to the integrated circuit 1200, such as a general purpose processor or special purpose application circuitry, or a combination of modules providing system-on-a-chip functionality supported by the memory array 1250.

In the example shown in FIG. 12, control circuitry 1210 using a bias arrangement state machine controls the application of bias arrangement supply voltage generated or provided through the voltage supply or supplies in block 1220, such as read and program voltages. The control circuitry 1210 is coupled to the buffer structure 1260, the ECC logic 1230 via a data bus 1235, and the memory array with ECCs 1250. The control circuitry 1210 includes logic to perform a logical process over pages of data during movement between the memory array and the input/output path through the buffer structure for at least one of page read and page write operations.

The control circuitry 1210 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit memory, comprising:
a memory array, including a plurality of data lines;
a buffer structure coupled to the plurality of data lines, including a plurality of bundles of multiple storage elements to store bit-level status values for data lines in the plurality of data lines;
logic including a plurality of bundle status circuits to indicate bundle-level status values of corresponding bundles of multiple storage elements in the buffer structure based on the bit-level status values in the corresponding bundles; and
a set of bit-level status lines connected to bundle status circuits in the plurality of bundle status circuits,
wherein each of the bundle status circuits is coupled to multiple storage elements in a respective bundle, and includes circuitry configured to load the bit-level status values stored in the multiple storage elements in the respective bundle to the set of bit-level status lines, in response to the bundle status circuit detecting a fail status in at least one of the bit-level status values.

2. The memory of claim 1, wherein the logic includes:
the plurality of bundle status circuits arranged in a daisy chain, the bundle status circuits coupled to respective bundles in the buffer structure, producing an output of the daisy chain indicating detection of a bundle in the fail status; and
control circuitry which executes cycles to determine the output of the daisy chain, each cycle clearing a bundle status circuit indicating the fail status if the output indicates detection of a bundle in the fail status in the cycle, and repeating the cycles until the output indicates no bundle status circuits have the fail status.

3. The memory of claim 1, further including logic, in response to detection of a bundle having at least one bit with the fail status, to count the storage elements in the buffer structure within the bundle having the fail status.

4. The memory of claim 1, further including logic, in response to detection of a bundle having at least one bit with the fail status, to identify a storage element in the buffer structure within the bundle having the fail status.

5. The memory of claim 1, further including control logic executing program operation, including a program cycle including program pulse and program verify, and executing another program cycle if a number of storage elements having the fail status in the buffer structure exceeds a retry threshold.

6. The memory of claim 2, said each cycle includes:
searching for a bundle status circuit indicating the fail status, if the output of the daisy chain indicates detection of a bundle in a fail status in the cycle and before clearing the bundle status circuit indicating the fail status.

7. The memory of claim 6, said each cycle further comprising:
configuring bundle status circuits in a portion of the daisy chain to pass input signal levels in response to bundle-level status values stored in the bundle status circuits in the portion;
configuring bundle status circuits outside the portion and in the daisy chain to pass input signal levels independent of bundle-level status values stored in the bundle status circuits outside the portion and in the daisy chain; and
searching for the bundle status circuit indicating the fail status within the portion.

8. The memory of claim 2, wherein a bundle status circuit in the plurality of bundle status circuits includes:
a first latch storing a bundle-level status value of a corresponding bundle of data in the buffer structure based on the bit-level status values in the corresponding bundle;
a pass gate connected to an input and an output of the bundle status circuit, to pass an input signal level at the input to the output of the bundle status circuit, in response to the bundle-level status value stored in the first latch and a selection input of the bundle status circuit; and
a second latch coupled to the first latch, having a first state in which the first latch storing the fail status keeps the fail status, and having a second state in which the first latch storing the fail status is cleared, wherein the first state and the second state are set in response to the input signal level at the input of the bundle status circuit.

9. The memory of claim 8, the bundle status circuit comprising:
circuitry configured so that, if the selection input is at a first signal level, the pass gate passes the input signal level to the output in response to a bundle-level status value stored in the bundle status circuit, and if the selection input is at a second signal level, the pass gate passes the input signal level to the output independent of the bundle-level status value stored in the bundle status circuit.

10. The memory of claim 1, comprising circuitry configured to store the fail status in the bundle status circuit if a bit-level status value stored in at least one of the storage elements in the respective bundle is the fail status, otherwise to store a pass status different than the fail status in the bundle status circuit.

11. The memory of claim 2, comprising:
keeping count of bundle status circuits indicating the fail status during the cycles.

12. A method of operating an integrated circuit memory, the memory comprising a buffer structure coupled to the plurality of data lines, including a plurality of bundles of multiple storage elements to store bit-level status values for data lines in the plurality of data lines, a plurality of bundle status circuits arranged in a daisy chain, the bundle status circuits coupled to corresponding bundles of multiple storage elements in the buffer structure, and a set of bit-level status lines connected to bundle status circuits in the plurality of bundle status circuits, wherein each of the bundle status circuits is coupled to multiple storage elements in a respective bundle, the method comprising:
executing cycles to determine an output of the daisy chain, each cycle clearing a bundle status circuit indicating a fail status if the output indicates detection of a bundle in a fail status in the cycle, and each cycle loading the bit-level status values stored in the multiple storage elements in the respective bundle to the set of bit-level status lines, in response to the bundle status circuit detecting the fail status in at least one of the bit-level status values;
repeating the cycles until the output indicates no bundle status circuits have the fail status; and
keeping count of bundle status circuits indicating the fail status during the cycles.

13. The method of claim 12, comprising:
in response to detection of a bundle having at least one bit with the fail status, counting the storage elements in the buffer structure within the bundle having the fail status.

14. The method of claim 12, comprising:
in response to detection of a bundle having at least one bit with the fail status, identifying a storage element in the buffer structure within the bundle having the fail status.

15. The method of claim 12, comprising:
executing program operation, including a program cycle including program pulse and program verify, and executing another program cycle if a number of storage elements having the fail status in the buffer structure exceeds a retry threshold.

16. The method of claim 12, said each cycle comprising:
searching for a bundle status circuit indicating the fail status, if the output of the daisy chain indicates detection of a bundle in a fail status in the cycle and before clearing the bundle status circuit indicating the fail status.

17. The method of claim 16, said each cycle further comprising:
configuring bundle status circuits in a portion of the daisy chain to pass input signal levels in response to bundle-level status values stored in the bundle status circuits in the portion;

configuring bundle status circuits outside the portion and in the daisy chain to pass input signal levels independent of bundle-level status values stored in the bundle status circuits outside the portion and in the daisy chain; and searching for the bundle status circuit indicating the fail status within the portion.

18. The method of claim 12, comprising:

storing the fail status in the bundle status circuit if a bit-level status value stored in at least one of the storage elements in the respective bundle is the fail status, otherwise storing a pass status different than the fail status in the bundle status circuit.

19. The method of claim 12, comprising:

keeping count of bundle status circuits indicating the fail status during the cycles.

* * * * *